US009816183B2

(12) United States Patent  
Ashihara et al.

(10) Patent No.: US 9,816,183 B2  
(45) Date of Patent: Nov. 14, 2017

(54) SUBSTRATE PROCESSING APPARATUS

(71) Applicant: HITACHI KOKUSAI ELECTRIC INC., Tokyo (JP)

(72) Inventors: Hiroshi Ashihara, Toyama (JP); Motoshi Sawada, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/259,944

(22) Filed: Sep. 8, 2016

(65) Prior Publication Data

US 2017/0067157 A1 Mar. 9, 2017

(30) Foreign Application Priority Data

Sep. 8, 2015 (JP) ................................. 2015-176761

(51) Int. Cl.
- C23C 14/50 (2006.01)
- C23C 16/44 (2006.01)
- C23C 16/455 (2006.01)
- C23C 16/458 (2006.01)

(Continued)

(52) U.S. Cl.
CPC .......... *C23C 16/4405* (2013.01); *C23C 14/50* (2013.01); *C23C 16/4401* (2013.01); *C23C 16/4408* (2013.01); *C23C 16/4409* (2013.01); *C23C 16/4412* (2013.01); *C23C 16/4583* (2013.01); *C23C 16/45565* (2013.01); *C23C 16/45587* (2013.01); *C23C 16/45591* (2013.01);

(Continued)

(58) Field of Classification Search
None  
See application file for complete search history.

(56) References Cited

U.S. PATENT DOCUMENTS 3,784,215 A * 1/1974 Ruthenberg ............... F16J 9/14  
                                                251/306  
5,314,215 A * 5/1994 Weinhold .............. F16L 23/032  
                                                285/283

(Continued)

FOREIGN PATENT DOCUMENTS

| DE | 10203854 A1 * | 8/2003 | ............ F16L 23/023 |
| FR | 2698758 A1 * | 6/1994 | ........... B05B 15/001 |

(Continued)

*Primary Examiner* — Jeffrie R Lund  
*Assistant Examiner* — Stanislav Antolin  
(74) *Attorney, Agent, or Firm* — Vople and Koenig, P.C.

(57) ABSTRACT

A substrate processing apparatus includes: a process container where a substrate is processed; a process gas supply unit configured to supply a process gas into the process container; a substrate placing table installed in the process container; a shaft penetrating a hole at a bottom portion of the process container and coupled to the substrate placing table; a bellows surrounding the shaft and disposed outside of the process container wherein an inner space thereof is in communication with a space of the process container; an inert gas supply system configured to supply an inert gas into the inner space of the bellows disposed outside of the process container; and a component falling prevention unit including at least a first structure disposed along a first portion of the hole at the bottom of the process container and a second structure disposed along a second portion of the hole adjacent to the first structure.

18 Claims, 11 Drawing Sheets

(51) Int. Cl.
*H01L 21/687* (2006.01)
*H01J 37/32* (2006.01)

(52) U.S. Cl.
CPC .. *H01J 37/32871* (2013.01); *H01L 21/68764* (2013.01); *H01L 21/68792* (2013.01)

(56) References Cited

U.S. PATENT DOCUMENTS

| | | | | |
|---|---|---|---|---|
| 5,508,519 | A * | 4/1996 | Bennett | C23C 14/564 250/492.21 |
| 5,879,574 | A * | 3/1999 | Sivaramakrishnan | C23C 16/4405 134/1.1 |
| 6,106,634 | A * | 8/2000 | Ghanayem | B08B 17/02 118/719 |
| 6,315,335 | B1 * | 11/2001 | Seedorff | F16L 23/0283 285/412 |
| 7,279,049 | B2 | 10/2007 | Kaszuba et al. | |
| 2002/0053512 | A1 * | 5/2002 | Grohman | C23C 14/3407 204/298.12 |
| 2003/0015138 | A1 * | 1/2003 | Tometsuka | C23C 16/45519 118/715 |
| 2005/0170306 | A1 * | 8/2005 | Oosterlaken | H01L 21/67126 432/241 |
| 2005/0172905 | A1 | 8/2005 | Kaszuba et al. | |
| 2005/0175952 | A1 * | 8/2005 | Toba | H01L 21/67109 432/241 |
| 2006/0150904 | A1 * | 7/2006 | Ozaki | C23C 16/4401 118/715 |
| 2006/0199131 | A1 * | 9/2006 | Kawasaki | C23C 16/4581 432/120 |
| 2006/0243269 | A1 * | 11/2006 | Berenbak | H01L 21/67126 126/109 |
| 2007/0029193 | A1 * | 2/2007 | Brcka | C23C 14/345 204/298.02 |
| 2007/0264840 | A1 * | 11/2007 | Itatani | C23C 16/4412 438/758 |
| 2008/0017116 | A1 * | 1/2008 | Campbell | C23C 14/505 118/729 |
| 2008/0017117 | A1 * | 1/2008 | Campbell | C23C 16/4584 118/729 |
| 2008/0141942 | A1 * | 6/2008 | Brown | C23C 14/564 118/723 R |
| 2009/0197409 | A1 * | 8/2009 | Morita | C23C 16/4401 438/680 |
| 2010/0050945 | A1 * | 3/2010 | Morita | C23C 16/4412 118/733 |
| 2010/0051597 | A1 * | 3/2010 | Morita | H01L 21/67109 219/201 |
| 2010/0120259 | A1 * | 5/2010 | Vatus | C23C 16/4585 438/758 |
| 2010/0136773 | A1 * | 6/2010 | Akae | C23C 16/4408 438/507 |
| 2010/0229353 | A1 * | 9/2010 | Gayer | B01J 3/002 24/457 |
| 2011/0305835 | A1 * | 12/2011 | Bertram, Jr. | C23C 16/45568 427/255.23 |
| 2013/0129577 | A1 * | 5/2013 | Halpin | B01J 8/0035 422/236 |
| 2015/0083042 | A1 * | 3/2015 | Kobayashi | H01L 21/68792 118/500 |
| 2015/0376780 | A1 * | 12/2015 | Khaja | C23C 16/4405 134/1.1 |
| 2016/0010239 | A1 * | 1/2016 | Tong | C23C 16/4584 392/416 |
| 2016/0083837 | A1 * | 3/2016 | Narushima | C23C 16/4408 118/725 |

FOREIGN PATENT DOCUMENTS

| | | | | |
|---|---|---|---|---|
| FR | 2820190 | A1 * | 8/2002 | ............... F16L 5/02 |
| JP | 06-020957 | A | 1/1994 | |
| JP | 08-139026 | A | 5/1996 | |
| JP | 2004-214314 | A | 7/2004 | |
| JP | 2007-311814 | A | 11/2007 | |
| JP | 2007311814 | A * | 11/2007 | ........... H01L 21/683 |
| JP | WO 2014178160 | A1 * | 11/2014 | ......... C23C 16/4408 |
| WO | 2014/178160 | A1 | 11/2014 | |
| WO | WO 2015047722 | A1 * | 4/2015 | ....... H01L 21/68792 |

* cited by examiner

FIG. 8A
FIG. 8B
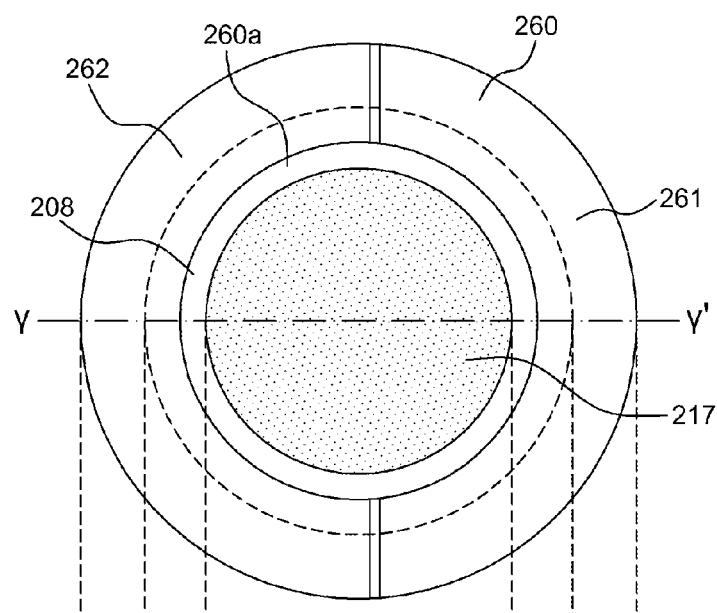
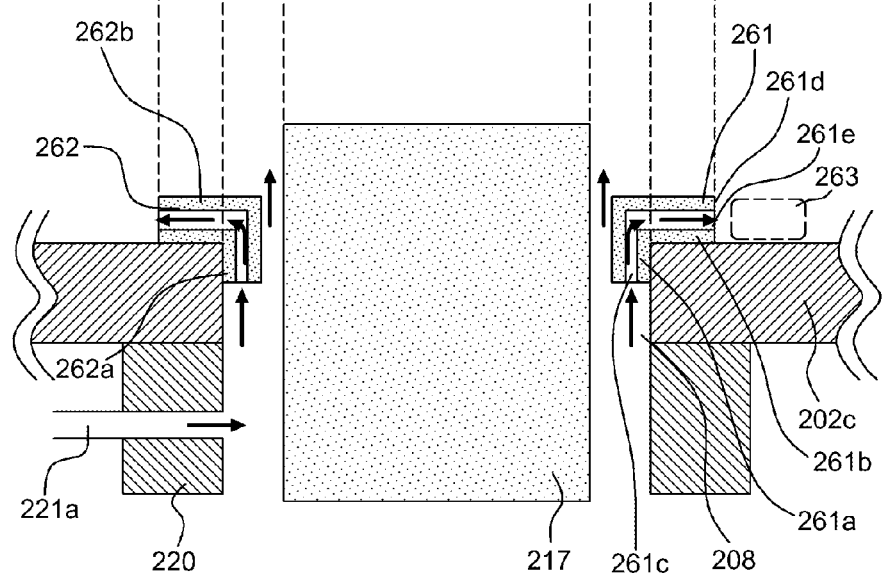

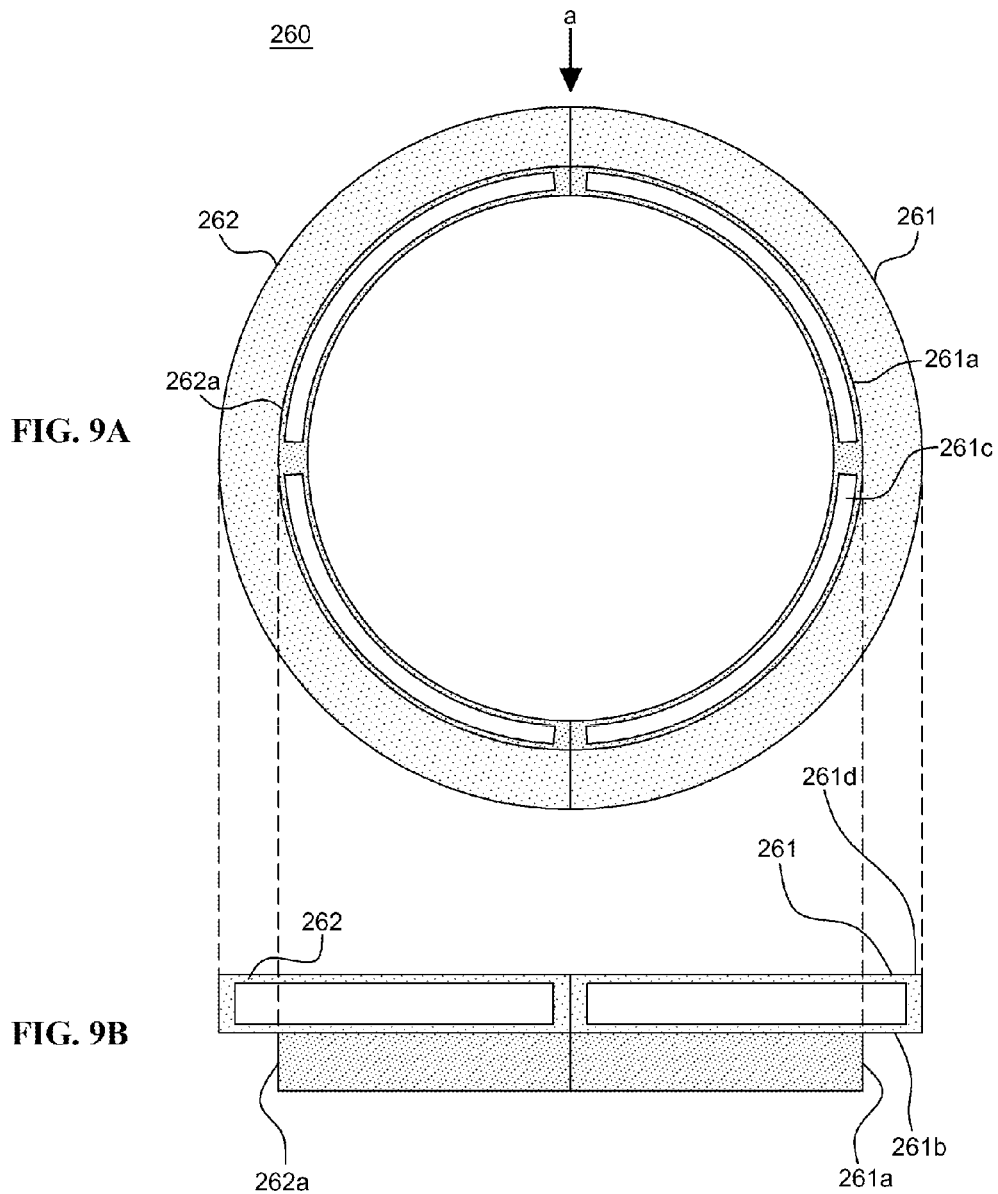

SUBSTRATE PROCESSING APPARATUS

CROSS-REFERENCE TO RELATED PATENT APPLICATION

This non-provisional U.S. patent application claims priority under 35 U.S.C. §119 of Japanese Patent Application No. 2015-176761, filed on Sep. 8, 2015, the entire contents of which are hereby incorporated by reference.

BACKGROUND

1. Field

The present disclosure relates to a substrate processing apparatus.

2. Description of the Related Art

As a semiconductor device such as a flash memory is highly integrated, a pattern has been significantly miniaturized.

Since the miniaturized pattern is considerably affected by particles, it is necessary to suppress the formation of particles.

SUMMARY

Described herein is a technique capable of suppressing the formation of particles.

According to one aspect described herein, there is provided a substrate processing apparatus including: a process container where a substrate is processed; a process gas supply unit configured to supply a process gas into the process container; a substrate placing table installed in the process container; a shaft penetrating a hole at a bottom portion of the process container and coupled to the substrate placing table; a bellows surrounding the shaft and disposed outside of the process container wherein an inner space thereof is in communication with a space of the process container; an inert gas supply system configured to supply an inert gas into the inner space of the bellows and disposed outside of the process container; and a component falling prevention unit including at least a first structure disposed along a first portion of the hole at the bottom of the process container and a second structure disposed along a second portion of the hole adjacent to the first structure.

BRIEF DESCRIPTION OF THE DRAWINGS

FIGS. 8A and 8B are diagrams illustrating a component falling prevention unit according to a second embodiment described herein.

FIGS. 9A and 9B are diagrams illustrating the component falling prevention unit according to the second embodiment described herein.

DETAILED DESCRIPTION OF THE PREFERRED EMBODIMENTS

First Embodiment

Hereafter, a first embodiment will be described.

<Apparatus Configuration>

Figure 1:
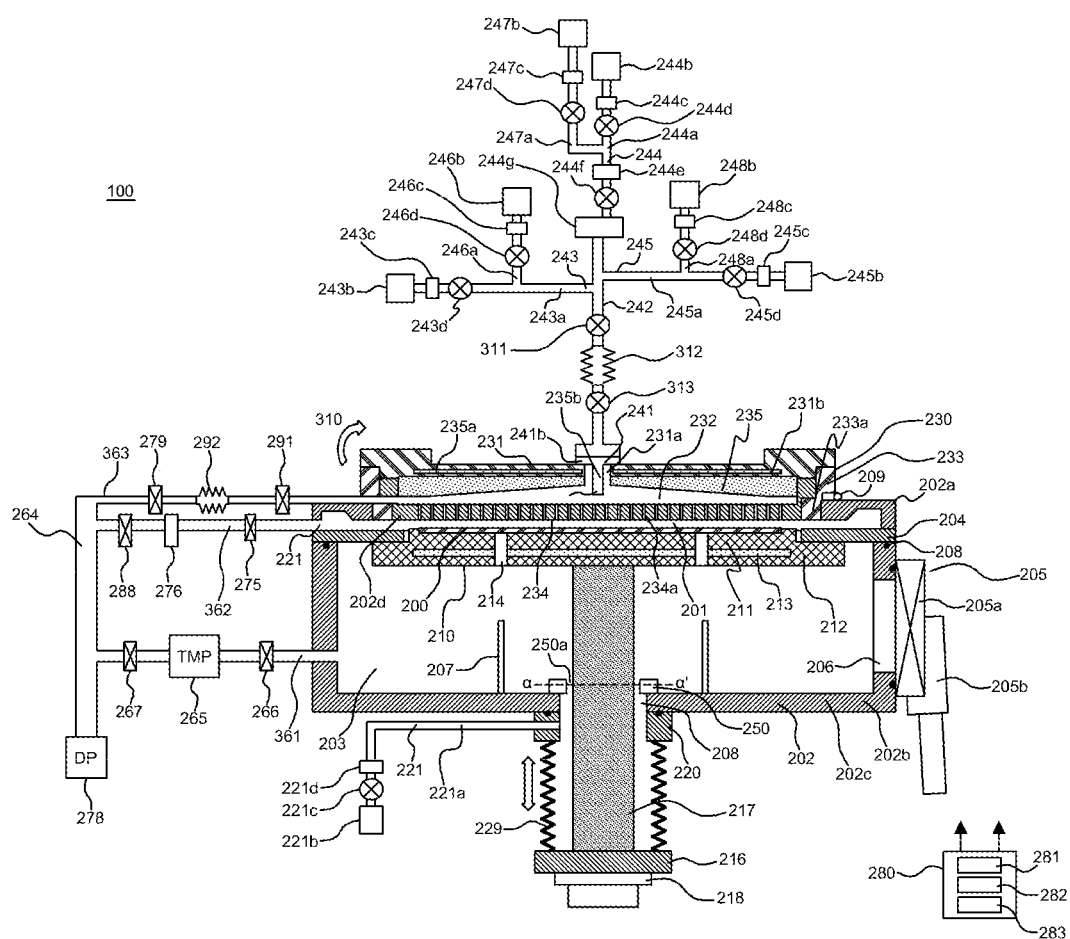
FIG. 1 is a diagram illustrating a substrate processing apparatus according to a first embodiment described herein.

FIG. 1 illustrates a substrate processing apparatus 100 according to a first embodiment. As illustrated in FIG. 1, the substrate processing apparatus 100 is a single-wafer type substrate processing apparatus.

(Process Container)

As illustrated in FIG. 1, the substrate processing apparatus 100 includes a process container 202. The process container 202 has a circular cross-sectional surface, and is a flat airtight container. The process container 202 is formed of a metal material such as aluminum (Al) and stainless steel (SUS). The process container 202 has a process space 201 in which a wafer 200 such as a silicon substrate is processed and a transfer space 203 through which the wafer 200 is passed when the wafer 200 is transferred to the process space 201. The process container 202 includes an upper container 202*a* and a lower container 202*b*. Between the upper container 202*a* and the lower container 202*b*, a partition plate 204 is installed.

The lower container 202*b* has a substrate loading/unloading port 206 formed at a side thereof, the substrate loading/unloading port 206 being adjacent to a gate valve 205. The wafer 200 is moved between a vacuum transfer chamber (not illustrated) and the transfer space 203 through the substrate loading/unloading port 206. The lower container 202*b* has a plurality of lift pins 207 installed at the bottom thereof. The lower container 202*b* is grounded.

The gate valve 205 includes a valve body 205*a* and a driving body 205*b*. The valve body 205*a* is fixed to a part of the driving body 205*b*. When the gate valve is opened, the driving body 20*b* moves away from the process container 202, and the valve body 205*a* is separated from the sidewall of the process container 202. When the gate valve is closed, the driving body 20*b* moves toward the process container 202, and the valve body 205*a* presses the sidewall of the process container 202 so as to close the substrate loading/unloading port 206.

The process space 201 has a substrate placing table 210 installed therein, the substrate placing table 210 supporting the wafer 200. The substrate placing table 210 includes a substrate placing table 212 and a heater 213. The substrate placing table 212 has a placing surface 211 on which the wafer 200 is placed, and the heater 213 is a heating source embedded in the substrate placing table 212. The substrate placing table 212 has a plurality of through-holes 214 through which the respective lift pins 207 are passed, the plurality of through-holes 214 being formed at positions corresponding to the respective lift pins 207.

Figure 4A:
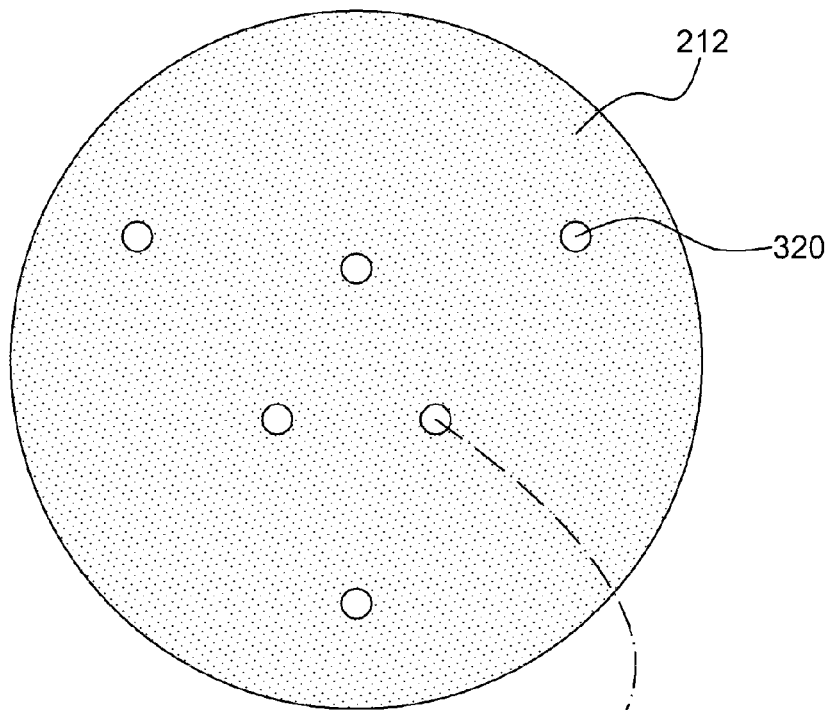
FIGS. 4A and 4B are diagrams illustrating a substrate placing table according to the first embodiment described herein.
Figure 4B:
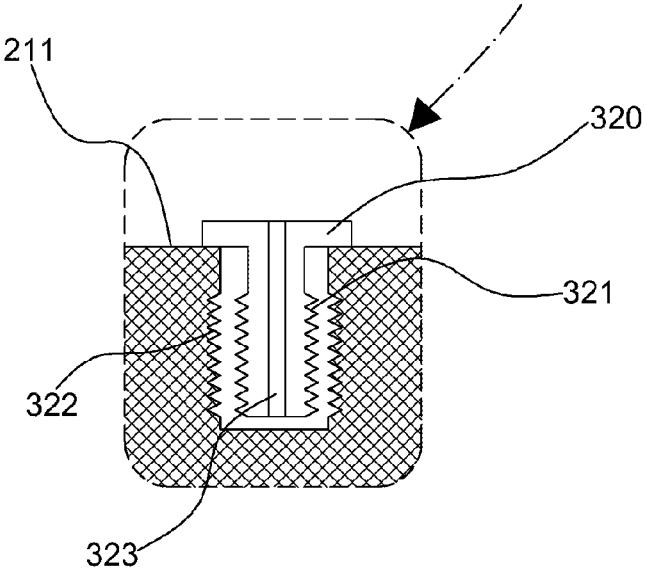

Referring to FIGS. 4A and 4B, the substrate placing table 212 and floating pins 320 will be described. FIG. 4A is a plan view of the substrate placing table 212. FIG. 4B is a cross-sectional view of a location where a floating pin 320 of FIG. 4A is installed. As illustrated in FIG. 4A, the substrate placing table 212 has a plurality of floating pins 320 on which a substrate is placed. In FIG. 4A, the floating pins 320 are represented by 0. For convenience of description, the through-holes 214 are omitted in FIG. 4A.

The floating pins 320 support the wafer 200. Each of the floating pins 320 includes a screw having a screw thread formed at the front end thereof. The screw thread 321 is coupled to a screw thread 322 of the substrate placing table 212. Each of the floating pins 320 has a concave portion 323 formed from the lower end to the upper end of the screw. The atmosphere between the screw thread 321 and the screw thread 322 may be discharged through the concave portion 323.

The floating pins 320 serve to adjust an interval between the substrate placing surface 211 and the bottom surface of the wafer 200 at the central and circumferential portions of the wafer 200. As the interval is adjusted by the floating pins 320, the influence of the heater 213 may be uniformized at the central and circumferential portions of the wafer 200.

When each of the floating pins 320 is fixed through the screw thread 321 and the screw thread 322, a distance between the substrate placing surface 211 and the bottom surface of the wafer 200 is not varied by an environmental change such as a pressure variation and temperature change during substrate processing. Furthermore, the atmosphere between the female screw and the male screw which are expanded by an environmental change can be discharged through the concave portion 323, which makes it possible to prevent the tightened floating pins 320 from being loosened.

In addition to the measure described above, a mass production device which repetitively processes wafers 200 requires an additional maintenance. For example, when the mass production device processes one lot of wafers (for example, 50 wafers), the floating pins 320 may be loosened by an environmental change. Thus, when maintenance is performed, a maintenance operator needs to periodically tighten the floating pins 320.

The substrate placing table 212 is coupled to an upper end of a shaft 217. The shaft 217 has a main portion penetrating a hole 208 installed at the bottom portion 202c of the process container 202, the main portion being connected to an elevating mechanism 218 outside the process container 202 with a support plate 216 interposed therebetween. As the elevating mechanism 218 lifts/lowers the shaft 217 and the substrate placing table 212, the wafer 200 placed on the substrate placing surface 211 may be lifted/lowered. The periphery (outer circumference) of the lower portion of the shaft 217 is covered by a bellows 219. The inside of the process container 202 is sealed.

The process container 202 has a component falling prevention unit 250 installed on the bottom portion 202c along the hole 208, the component falling prevention unit 250 being detachable from the bottom portion 202c. The component falling prevention unit 250 runs along the circumference of the shaft 217 as described below. A predetermined gap 250a is present between the outer wall of the shaft 217 and the component falling prevention unit 250. The gap 250a is formed to such an extent that the shaft 217 is not in contact with the component falling prevention unit 250 when the shaft 217 is vertically moved. Specifically, the gap 250a has a size that does not allow a component such as a screw described below to fall into the gap 250a.

The component falling prevention unit 250 has a ring shape surrounding the shaft 217. The component falling prevention unit 250 includes a plurality of component falling prevention structures, and each of the component falling prevention structures constitutes a part of the ring. During maintenance of the substrate processing apparatus 100, the component falling prevention structures are detached and disassembled. Thus, although the shaft 217 is not detached from the process container 202, the component falling prevention unit 250 can be exchanged.

Between the upper end of the bellows 219 and the bottom portion 202c, an upper pressing portion 220 is installed. The upper pressing portion 220 is connected to an inert gas supply pipe 221a constituting an inert gas supply unit 221, and communicates with the inner space of the bellows 219.

An inert gas supply source 221b, a valve 221c and an MFC (Mass Flow Controller) 221d are sequentially installed on the inert gas supply pipe 221a from the upstream side toward the downstream side of the inert gas supply pipe 221a. An inert gas supplied from the inert gas supply source 221b is supplied between the upper end of the bellows 219 and the bottom portion 202c through the valve 221c and the MFC 221d. The inert gas is supplied to prevent a raw material gas from permeating into the bellows 219.

The inert gas supply unit 221 includes the inert gas supply pipe 221a, the valve 221c and the MFC 221d. The inert gas supply unit 221 may further include the inert gas supply source 221b.

When the wafer 200 is transferred, the substrate placing table 212 is lowered to a position at which the substrate placing surface 211 faces the substrate loading/unloading port 206. Hereafter, the position will be referred to as a wafer transfer position. When the wafer 200 is processed as illustrated in FIG. 1, the substrate placing table 212 is lifted until the substrate placing table 212 reaches a position within the process space 201, at which the wafer 200 is processed. Hereafter, the position will be referred to as a wafer process position.

Specifically, when the substrate placing table 212 is lowered to the wafer transfer position, the upper ends of the lift pins 207 protrude from the substrate placing surface 211, and the lift pins 207 support the wafer 200 from thereunder. When the substrate placing table 212 is lifted to the wafer process position, the lift pins 207 are buried from the substrate placing surface 211, and the substrate placing surface 211 supports the wafer 200 from thereunder. Since the lift pins 207 are in direct contact with the wafer 200, the lift pins 207 may be formed of a material such as quartz and alumina.

A showerhead 230 is installed at the upstream side of the process space 201, the shower head 230 including a detachable dispersion plate. The shower head 230 functions as a gas dispersion mechanism, and is inserted into a hole 202d installed in the upper container 202a. The shower head 230 is fixed to the upper container 202a through a hinge 209. During maintenance, the shower head 230 is opened along an arrow 310 with the hinge 209 set to an axis.

The shower head 230 includes a lid 231 having a gas introduction hole 231a into which a first dispersion mechanism 241 is inserted. The first dispersion mechanism 241 includes a front end portion 241a inserted into the shower head and a flange 241b fixed to the lid 231.

Figure 2:
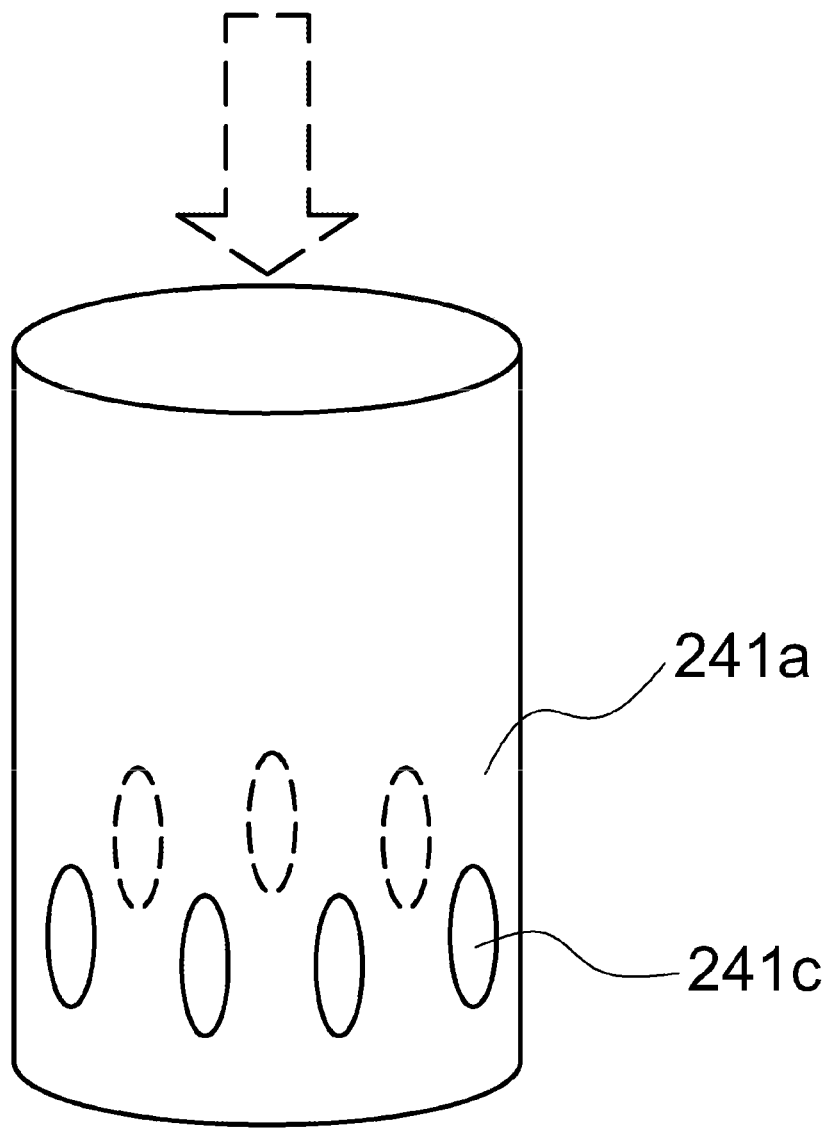
FIG. 2 is a diagram illustrating a first dispersion structure according to the first embodiment described herein.

FIG. 2 is a diagram illustrating the front end portion 241a of the first dispersion mechanism 241. An arrow depicted by a dotted line in FIG. 2 indicates a direction in which a gas is supplied. The front end portion 241a may be cylindrical. The front end portion 241a has dispersion holes 241c formed at the side surface of the cylinder. A gas supplied through a process gas supply unit (supply system) described later is supplied to a buffer space 232 through the front end portion 241a and the dispersion holes 241c.

The lid 231 of the shower head 230 is formed of a metal with electrical conductivity or thermal conductivity. Between the lid 231 and the upper container 202a, a block 233 is installed to insulate the lid 231 and the upper container 202a from each other.

The shower head 230 includes a dispersion plate 234 which is a second dispersion mechanism for dispersing a gas. The upstream side of the dispersion plate 234 corresponds to the buffer space 232, and the downstream side of the dispersion plate 234 corresponds to the process space 201. The dispersion plate 234 includes a plurality of through-holes 234a. The dispersion plate 234 is disposed to face the substrate placing surface 211.

The lid 231 has a shower head heating unit 231b installed therein, the shower head heating unit 231b serving to heat the shower head 230. The shower head heating unit 231b heats the shower head 230 to a temperature at which the gas supplied to the buffer space 232 is not liquefied. The shower head heating unit 231b heats the shower head 230 at a temperature of 100° C., for example.

The dispersion plate 234 may have a discus shape. The through-holes 234a are present throughout the entire surface of the dispersion plate 234. The through-holes 234a may be arranged at even intervals, and the outermost through-holes 234a may be arranged outer than the outer circumference of the wafer placed on the substrate placing table 212.

The shower head 230 includes a gas guide 235 which guides a gas supplied from the first dispersion mechanism 241 to the dispersion plate 234. The gas guide 235 has an inner diameter which increases toward the dispersion plate 234. The inside of the gas guide 235 is cone-shaped. The lower end of the gas guide 235 is positioned outer than the outermost through holes 234a of the dispersion plate 234.

The block 233 is fixedly placed on the upper container 202a. The block 233 includes a flange 233a, and the dispersion plate 234 is fixedly placed on the flange 233a. The lid 231 is fixed to the upper surface of the block 233.

Figure 3:
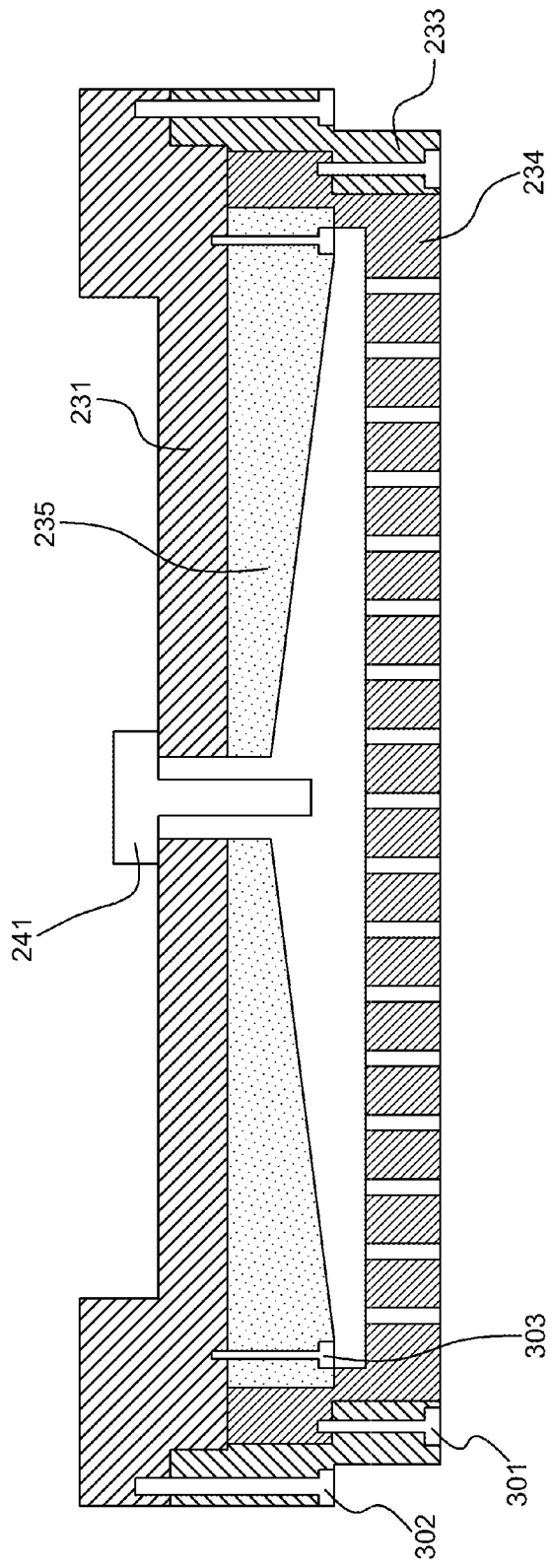
FIG. 3 is a diagram illustrating a shower head according to the first embodiment described herein.

Referring to FIG. 3, an example in which the shower head 230 is fixed will be described. FIG. 3 is an expanded view of the shower head 230. As illustrated in FIG. 3, the dispersion plate 234 is fixed to the block 233 or the lid 231 by a screw 301 or 302. The screws 301 and 302 may include a vacuum screw. The screws 301 and 302 are inserted from the process space 201.

As the screws are inserted from the process space 201, the first dispersion mechanism 241 may be easily detached after the shower head 230 is opened during maintenance.

The gas guide 235 is fixed to the lid 231 by a screw 303. During maintenance, the screws 301 and 302 are separated, and the first dispersion mechanism 241 is turned to separate the screw 303 and the gas guide 235 from each other.

Although the example in which the dispersion plate 234 is connected to the lid 231 with the block 233 interposed therebetween has been described, the present embodiment is not limited thereto. The dispersion plate 234 may be directly connected to the lid 231.

A film forming step described later includes a purge step of exhausting the buffer space 232. The film forming step includes an alternate supply step of alternately supplying different gases and the purge step of removing a residual gas while different gasses are supplied. The alternate supply step of alternately supplying different gases is repeated until a film is formed to a desired thickness. Thus, quite a long time is required for forming the film. Therefore, when the alternate supply step is performed, the time needs to be shortened as much as possible. In order to improve the yield, the film thickness or quality on the surface of the substrate is required to be uniformized.

Thus, the substrate processing apparatus according to the first embodiment includes the dispersion plate for uniformly dispersing a gas. The buffer space at the upstream side of the dispersion plate has a smaller volume than the process space 201, for example, which makes it possible to shorten the time required for performing the purge step of exhausting the buffer space.

(Supply System)

The gas introduction hole 231a installed in the lid 231 of the shower head 230 is connected to the first dispersion mechanism 241. The first dispersion mechanism 241 is connected to a common gas supply pipe 242. The flange installed in the first dispersion mechanism 241 is fixed to the lid 231 or a flange of the common gas supply pipe 242 by a screw or the like.

The first dispersion mechanism 241 and the common gas supply pipe 242 communicate with each other, and a gas supplied to the common gas supply pipe 242 is supplied into the shower head 230 through the first dispersion mechanism 241 and the gas introduction hole 231a.

A first gas supply pipe 243a, a second gas supply pipe 244a and a third gas supply pipe 245a are connected to the common gas supply pipe 242. The second gas supply pipe 244a is connected to the common gas supply pipe 242 through a remote plasma unit 244g.

A valve 311, a flexible pipe 312 and a valve 313 are installed at the downstream side of the junction of the first to third gas supply pipes 243a through 245a. During maintenance, the valves 311 and 313 may be closed, and the flexible pipe 312 may be detached to easily take out the shower head 230.

A first element containing gas is supplied mainly through a first gas supply system 243 including the first gas supply pipe 243a, and a second element containing gas is supplied mainly through a second gas supply system 244 including the second gas supply pipe 244a. When the wafer is processed, an inert gas is supplied mainly through a third gas supply system 245 including the third gas supply pipe 245a. When the shower head 230 or the process space 201 is cleaned, a cleaning gas is supplied mainly through the third gas supply system 245 including the third gas supply pipe 345a.

(First Gas Supply System)

A first gas supply source 243b, an MFC 243c serving as a flow rate controller, and a valve 243d serving as an opening/closing valve are sequentially installed on the first gas supply pipe 243a from the upstream side toward the downstream side of the first gas supply pipe 243a.

A gas containing a first element (hereafter, referred to as "first element containing gas") is supplied to the shower head 230 through the MFC 243c, the valve 243d and the common gas supply pipe 242 which are installed in the first gas supply pipe 243a.

The first element containing gas is one of raw material gases, i.e. processes gases. In the first embodiment, the first element may include titanium (Ti). That is, the first element containing gas may include a titanium-containing gas. The first element containing gas may be in a solid, liquid or gaseous state at normal temperature and pressure. When the first element containing gas is in a liquid state at normal temperature and pressure, a vaporizer may be installed between the first gas supply source 243b and the MFC 243c.

In the first embodiment, an example in which the first element containing gas is in a gaseous state will be described.

The downstream side of the valve 243d of the first gas supply pipe 243a is connected to the downstream end of a first inert gas supply pipe 246a. An inert gas supply source 246b, an MFC 246c serving as a flow rate controller and a valve 246d serving as an opening/closing valve are sequentially installed on the first inert gas supply pipe 246a from the upstream side toward the downstream side of the first inert gas supply pipe 246a. The inert gas serves as a carrier gas or dilution gas at the film forming step S104.

In the first embodiment, the inert gas may include nitrogen ($N_2$) gas. In addition to $N_2$ gas, a rare gas such as helium (He) gas, neon (Ne) gas and argon (Ar) gas may be used as the inert gas.

A first element containing gas supply system 243 which is also referred to as a titanium-containing gas supply system includes the first gas supply pipe 243a, the MFC 243c and the valve 243d.

A first inert gas supply system includes the first inert gas supply pipe 246a, the MFC 246c and the valve 246d. The first inert gas supply system may further include the inert gas supply source 246b and the first gas supply pipe 243a.

The first element containing gas supply system 243 may further include the first gas supply source 243b and the first inert gas supply system.

(Second Gas Supply System)

The remote plasma unit 244g is installed at the downstream side of the second gas supply pipe 244a. A second gas supply source 244b, an MFC 244c serving as a flow rate controller and a valve 244d serving as an opening/closing valve are sequentially installed on the second gas supply pipe 244a from the upstream side toward the downstream side of the second gas supply pipe 244a.

A gas containing a second element (hereafter, "second element containing gas") is supplied into the shower head 230 through the MFC 244c, the valve 244d, a tank 244e, the remote plasma unit 244g and the common gas supply pipe 242, which are installed on the second gas supply pipe 244a. The second element containing gas is excited in a plasma state by the remote plasma unit 244g, and supplied onto the wafer 200.

The second element containing gas is one of process gases. The second element containing gas may be regarded as a reaction gas or modification gas.

The second element containing gas contains a second element different from the first element. The second element includes any one of oxygen (O), nitrogen (N) and carbon (C), for example. In the first embodiment, the second element containing gas is a nitrogen-containing gas, for example. Specifically, ammonia ($NH_3$) gas may be used as the nitrogen-containing gas.

A second element containing gas supply system 244 which is also referred to as a nitrogen-containing gas supply system includes the second gas supply pipe 244a, the MFC 244c and the valve 244d.

The downstream side of the valve 244d of the second gas supply pipe 244a is connected to the downstream end of a second inert gas supply pipe 247a. An inert gas supply source 247b, an MFC 247c serving as a flow rate controller and a valve 247d serving as an opening/closing valve are sequentially installed on the second inert gas supply pipe 247a from the upstream side toward the downstream side of the second inert gas supply pipe 247a.

The inert gas is supplied into the shower head 230 through the MFC 247c, the valve 247d, the second gas supply pipe 244a and the remote plasma unit 244g, which are installed on the second inert gas supply pipe 247a. The inert gas serves as a carrier gas or dilution gas at the film forming step S104.

A second inert gas supply system includes the second inert gas supply pipe 247a, the MFC 247c and the valve 247d. The second inert gas supply system may further include the inert gas supply source 247b, the second gas supply pipe 244a and the remote plasma unit 244g.

The second element containing gas supply system 244 may further include the second gas supply source 244b, the remote plasma unit 244g and the second inert gas supply system.

(Third Gas Supply System)

A third gas supply source 245b, an MFC 245c serving as a flow rate controller and a valve 245d serving as an opening/closing valve are sequentially installed on the third gas supply pipe 245a from the upstream side toward the downstream side of the third gas supply pipe 245a.

An inert gas serving as a purge gas is supplied into the shower head 230 through the MFC 245c, the valve 245d and the common gas supply pipe 242, which are installed on the third gas supply pipe 245a.

In the first embodiment, the inert gas may include $N_2$ gas. In addition to $N_2$ gas, a rare gas such as helium (He) gas, neon (Ne) gas and argon (Ar) gas may be used as the inert gas.

The downstream end of a cleaning gas supply pipe 248a is connected to the downstream side of the valve 245d of the third gas supply pipe 245a. A cleaning gas supply source 248b, an MFC 248c serving as a flow rate controller and a valve 248d serving as an opening/closing valve are sequentially installed on the cleaning gas supply pipe 248a from the upstream side toward the downstream side of the cleaning gas supply pipe 248a.

The third gas supply system 245 includes the third gas supply pipe 245a, the MFC 245c and the valve 245d.

A cleaning gas supply system includes the cleaning gas supply pipe 248a, the MFC 248c and the valve 248d. The cleaning gas supply system may further include the cleaning gas supply source 248b and the third gas supply pipe 245a.

The third gas supply system 245 may further include the third gas supply source 245b and the cleaning gas supply system.

At a substrate processing step, the inert gas is supplied into the shower head 230 through the MFC 245c, the valve 245d and the common gas supply pipe 242, which are installed on the third gas supply pipe 245a. At a cleaning step, the cleaning gas is supplied into the shower head 230 through the MFC 248c, the valve 248d and the common gas supply pipe 242, which are installed on the cleaning gas supply pipe 248a.

The inert gas supplied from the third gas supply source 24b serves as a purge gas for purging a gas remaining in the process container 202 or the shower head 230 at the substrate processing step. At the cleaning step, the inert gas may serve as a carrier gas or dilution gas of the cleaning gas.

At the cleaning step, the cleaning gas supplied from the cleaning gas supply source 248b serves as a cleaning gas for removing by-products adhering to the shower head 230 or the process container 202.

In the first embodiment, the cleaning gas is a nitrogen trifluoride ($NF_3$) gas, for example. A hydrogen fluoride (HF) gas, a chlorine trifluoride ($ClF_3$) gas, a fluorine ($F_2$) gas or combinations thereof may be used as the cleaning gas.

(Exhaust System)

An exhaust system for exhausting the process container 202 includes a plurality of exhaust pipes connected to the process container 202. Specifically, the exhaust system includes an exhaust pipe 363 (first exhaust pipe) connected to the buffer space 232, an exhaust pipe 362 (second exhaust pipe) connected to the process space 201, and an exhaust pipe 361 (third exhaust pipe) connected to the transfer space 203. The exhaust system further includes an exhaust pipe 264 (fourth exhaust pipe) connected to the downstream sides of the exhaust pipes 361 through 363.

The exhaust pipe 361 is connected to a side surface or bottom surface of the transfer space 203. The exhaust pipe 361 has a TMP (Turbo Molecular Pump) installed thereon, the TMP providing a high-degree vacuum or ultra high-degree vacuum. A valve 266 serving as a first exhaust valve for the transfer space is installed at the upstream side of the TMP 265 from the exhaust pipe 361. A valve 267 is installed at the downstream side of the TMP 265. When the atmosphere is discharged through the exhaust pipe 362 or 363, the valve 267 prevents the discharged atmosphere from entering the TMP 265. When the atmosphere is discharged through the exhaust pipe 362 or 363, the valve 267 is closed.

The exhaust pipe 362 is connected to a sidewall of the process space 201. The exhaust pipe 362 has an APC (Automatic Pressure Controller) 276 installed thereon, the APC 276 serving as a pressure controller for controlling the internal pressure of the process space 201 to a predetermined pressure. The APC 276 includes a valve body (not illustrated) capable of adjusting an opening degree, and adjusts the conductance of the exhaust pipe 362 according to an instruction from a controller described later. A valve 275 is installed at the upstream side of the APC 276 installed in the exhaust pipe 362. The exhaust pipe 362, the valve 275 and the APC 276 are collectively referred to as a process chamber exhaust unit.

The exhaust pipe 363 is connected to a portion different from the portion to which the exhaust pipe 362 is connected. The exhaust pipe 363 is connected between the dispersion holes 234a and the gas guide 235 in the vertical direction. A valve 291, a flexible pipe 292 and a valve 279 may be sequentially installed on the exhaust pipe 363 from the upstream side toward the downstream side of the exhaust pipe 363. During maintenance, the valves 291 and 279 are closed, and the flexible pipe 292 is detached to open the shower head 230.

The exhaust pipe 363 and the valve 291 are collectively referred to as a shower head exhaust unit. The shower head exhaust unit may further include the valve 279 and the flexible pipe 292.

A DP (Dry Pump) 278 is installed on the exhaust pipe 264. As illustrated in FIG. 1, the exhaust pipes 363, 362 and 361 are sequentially connected to the exhaust pipe 264 from the upstream side toward the downstream side of the exhaust pipe 264, and the DP 278 is installed at the downstream side of the exhaust pipe 264. The DP 278 exhausts the buffer space 232, the process space 201 and the transfer space 203 through the exhaust pipe 362, the exhaust pipe 363 and the exhaust pipe 361, respectively. The DP 278 functions as an auxiliary pump when the TMP 265 is operated. The TMP 265 which is a high-degree vacuum (ultra high-degree vacuum) pump cannot exhaust the spaces to the atmospheric pressure by itself. Thus, the DP 278 is used as an auxiliary pump for exhausting the spaces to the atmospheric pressure. The valves of the above-described exhaust system may include an air valve.

(Component Falling Prevention Unit)

Figure 7A:
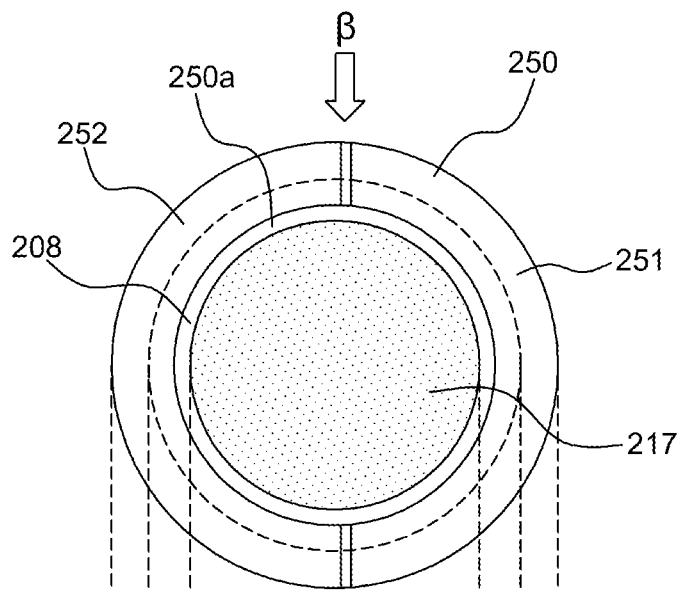
FIGS. 7A through 7C are diagrams illustrating a component falling prevention unit according to the first embodiment described herein.
Figure 7B:
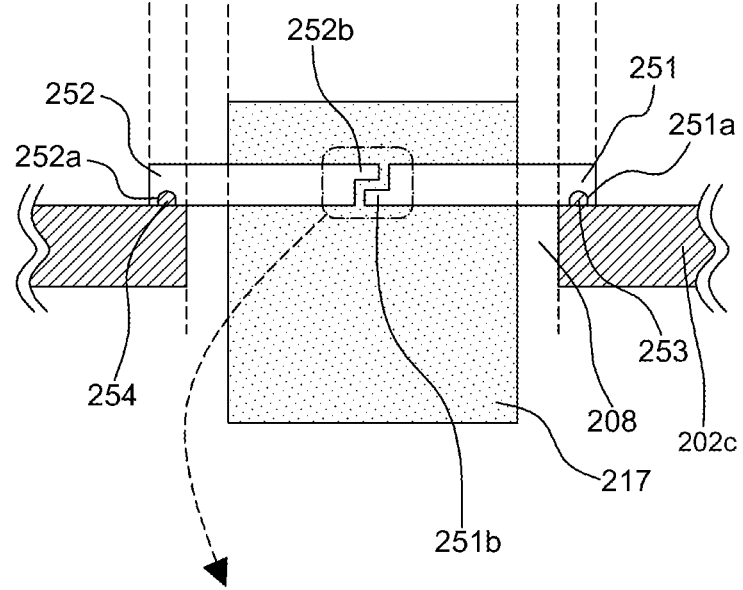
Figure 7C:
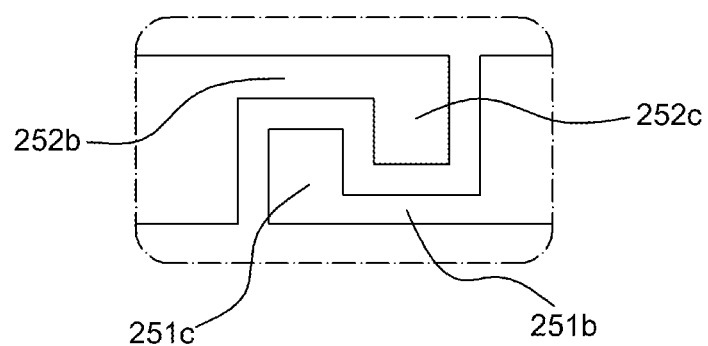

Referring to FIGS. 7A through 7C, the detailed configuration of the component falling prevention unit 250 will be described. The component falling prevention unit 250 serves to prevent a screw from falling into the bellows 219, the screw being detached when a maintenance operation is performed at a maintenance step S114 described later. In the first embodiment, "screw" may include the screws 301 through 303 and the floating pins 320 in FIGS. 3 and 4. Hereafter, the screws 301 through 303 and the floating pins 320 are collectively referred to as "screw or the like".

Hereafter, the detailed configuration of the component falling prevention unit 250 will be described. FIG. 7A is a cross-sectional view taken along the line α-α' of FIG. 1, and FIG. 7B is a side view seen from the direction of an arrow β. FIG. 7C is a diagram illustrating a location where first and second structures of the component falling prevention unit of FIG. 7B are adjacent or fitted to each other.

First, referring to FIG. 7A, the component falling prevention unit 250 will be described. The component falling prevention unit 250 includes first and second structures 251 and 252. The first and second structures 251 and 252 are installed to surround the outer circumferential surface of the shaft 217 along at least a part of the edge of the hole 208. The gap 250a is disposed between the shaft 217 and the first and second structures 251 and 252. The inner circumferences of the first and second structures 251 and 252 run along the outer circumference of the shaft 217. In the first embodiment, the first and second structures 251 and 252 are combined (coupled) to form a ring shape. The first and second structures 251 and 252 may be formed of quartz, silicon carbide (SiC) or ceramic.

The first and second structures 251 and 252 are adjacent to each other with a gap interposed therebetween. The gap is sufficiently wide such that the first and second structures 251 and 252 do not come in contact with each other even though the first and second structures 251 and 252 are heated and expanded. As the first and second structures 251 and 252 do not come in contact with each other even though the first and second structures 251 and 252 are heated and expanded, it is possible to prevent a problem such as damage caused by contact.

The gap 250a is disposed between the sidewall of the shaft 217 and the first structure 251. The gap 250a is sufficiently wide such that a detachable component such as a screw does not pass through the gap 250a during maintenance. During maintenance, a worker who conducts the maintenance wears gloves. Thus, when the worker detaches a screw or the like, the worker may miss the screw or the like. In this case, the screw or the like may fall into the transfer space 203.

After falling on the bottom portion 202c, the screw or the like may enter the hole 208 and fall into the bellows 219. During maintenance for detaching the dispersion plate 234 or the floating pins 320, it is difficult to pick up the screw or the like which fell into the bellows 219, because the shaft 217 is inserted into the bellows 219. When substrate processing is performed with the screw or the like in the bellows, the screw or the like may be moved in the bellows by contraction of the bellows 219 or a pressure variation. In this case, the screw or the like may scratch the inner wall of the bellows 219 or make a hole in the wall of the bellows 219.

Therefore, in the first embodiment, the gap 250a is sufficiently wide such that a screw or the like does not fall into the bellows 219. That is, the gap 250a has a size that does not allow a component such as a screw to pass through the gap 250a. For example, the width of the gap 250a is smaller than the diameter of the screw head. More specifically, the width of the gap 250a is set to be smaller than the length of the shortest part of the screw or the like. For example, "shortest part" may indicate the diameter of the front end of the screw, including the screw thread.

As illustrated in FIG. 7B, a concave portion 251a is installed on the first structure 251 at a contact surface between the first structure 251 and the bottom portion 202c, and a convex portion 253 is installed on the bottom portion 202c at the contact surface. A concave portion 252a is installed on the second structure 252 at a contact surface between the second structure 252 and the bottom portion 202c, and a convex portion 254 is installed on the bottom portion 202c at the contact surface. As the concave portion 251a and the convex portion 253 are engaged with each other, the first structure 251 is fixed to the bottom portion 202c. As the concave portion 252a and the convex portion 254 are engaged with each other, the second structure 252 is fixed to the bottom portion 202c.

When the first and second structures 251 and 252 are fixed as described above, the component falling prevention unit 250 does not deviate even under an environment where the pressure is frequently varied at the film forming step S104 described later.

If the component falling prevention unit 250 deviates, the component falling prevention unit 250 and the shaft 217 come in contact with each other. Thus, the shaft 217 may be scratched, or the component falling prevention unit 250 may be damaged. When the component falling prevention unit 250 is damaged, particles may be formed to have an adverse effect on the wafer 200. As the component falling prevention unit 250 is prevented from deviating, the above-described problems can be prevented.

A front end portion 251b corresponding to a flange of which the upper portion is cut is installed at a portion of the first structure 251, facing the second structure 252. A front end portion 252b corresponding to a flange of which the lower portion is cut is installed at a portion of the second structure 252, facing the first structure 251.

More desirably, the deviation of the component falling prevention unit 250 can be further prevented through the following components. Specifically, as illustrated in FIG. 7B, an upper surface of the front end portion 251b and an upper surface of the front end portion 252b face each other with a gap therebetween. FIG. 7C is an expanded view of the front end portions 251b and 252b. The front end portion 251b includes a convex structure 251c. The front end portion 252b also includes a convex structure 252c.

As the first and second structures 251 and 252 are adjacent to each other with a gap therebetween, the first and second structures 251 and 252 do not come in contact with each other even though the first and second structures 251 and 252 are expanded by heat.

Figure 11:
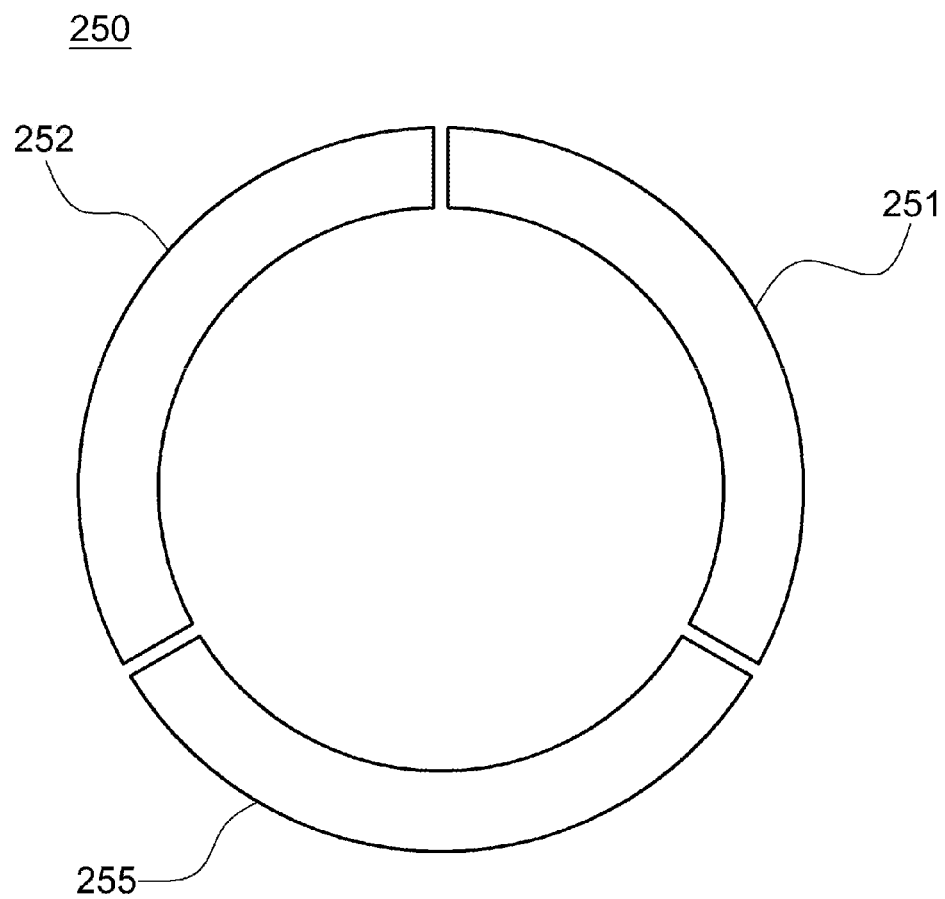
FIG. 11 is a diagram illustrating a component falling prevention unit according to a fourth embodiment described herein.

The convex portions 253 and 254 may include any structures as long as the convex portion 253 can fix the first structure 251 and the convex portion 254 can fix the second structure 252. For example, a plurality of convex portions 253 and a plurality of convex portions 254 may be installed along the hole 208, and the convex portions 253 and 254 may also be installed in a plate shape along the hole 208. The concave portions corresponding to the convex portions 253 and 254 have a matching shape with the convex portions 253 and 254. In the first embodiment, the component falling prevention unit 250 constituted by two structures, i.e. the first and second structures 251 and 252 is exemplified. However, the first embodiment is not limited thereto. For example, as illustrated in FIG. 11, the component falling prevention unit 250 may include three or more structures such as first to third structures 251, 252 and 255. That is, the component falling prevention unit 250 may include a plurality of structures.

(Controller)

The substrate processing apparatus 100 includes a controller 280 for controlling the operations of the components of the substrate processing apparatus 100. The controller 280 includes at least a calculation unit 281 and a memory unit 282. The controller 280 is connected to the components described above, calls a program or recipe from the memory unit 282 according to an instruction of an upper controller or user, and controls the operations of the components according to the contents of the program or recipe. The controller 280 may be embodied by a dedicated computer or embodied by a general-purpose computer. For example, an external memory device 283 storing the program may be prepared, and a program may be installed in a general-purpose computer through the external memory device 283, in order to embody the controller 280 according to the first embodiment. The external memory device 283 may include a magnetic disk such as a magnetic tape, flexible disk and hard disk, an optical disk such as CD and DVD, a magneto-optical disk such as MO, and a semiconductor memory such as a USB flash drive and memory card. The unit for supplying a program to the computer is not limited to the external memory device 283. For example, the program may be supplied through a communication unit such as the Internet and a dedicated line, without the external memory device 283. The memory unit 282 or the external memory device 283 may be embodied by a non-transitory computer readable recording medium. Hereafter, they are simply referred to as recording media. In this specification, when a recording medium is used, it may indicate that only the memory unit 282 is included, only the external memory device 283 is included, both of the memory unit 282 and the external memory device 283 are included.

<Substrate Processing Step>

Next, a step of forming a thin film on the wafer 200 using the substrate processing apparatus 100 will be described. In the following descriptions, the operations of the components constituting the substrate processing apparatus 100 are controlled by the controller 280.

Figure 5:
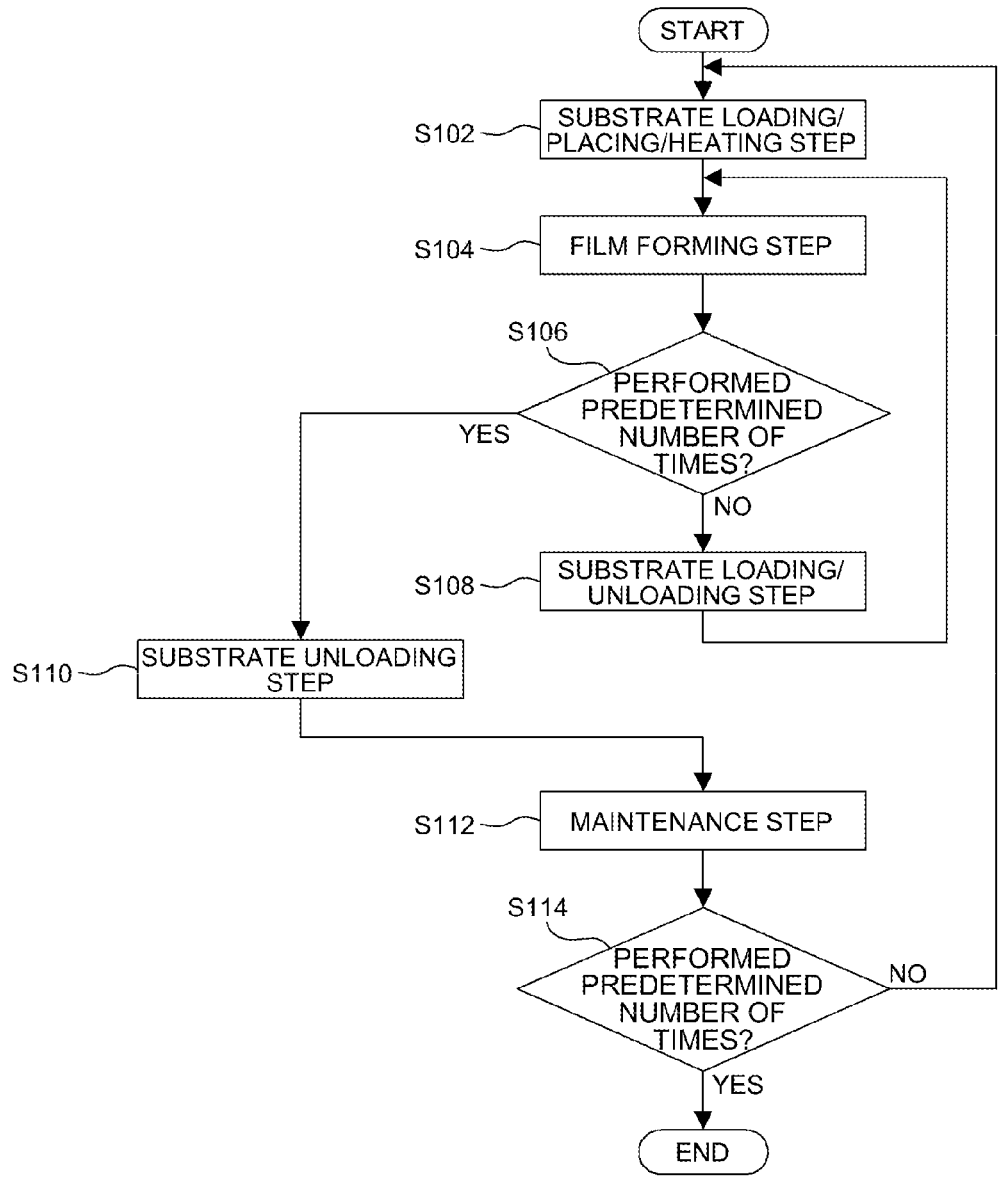
FIG. 5 is a flowchart illustrating a substrate processing step.
Figure 6:
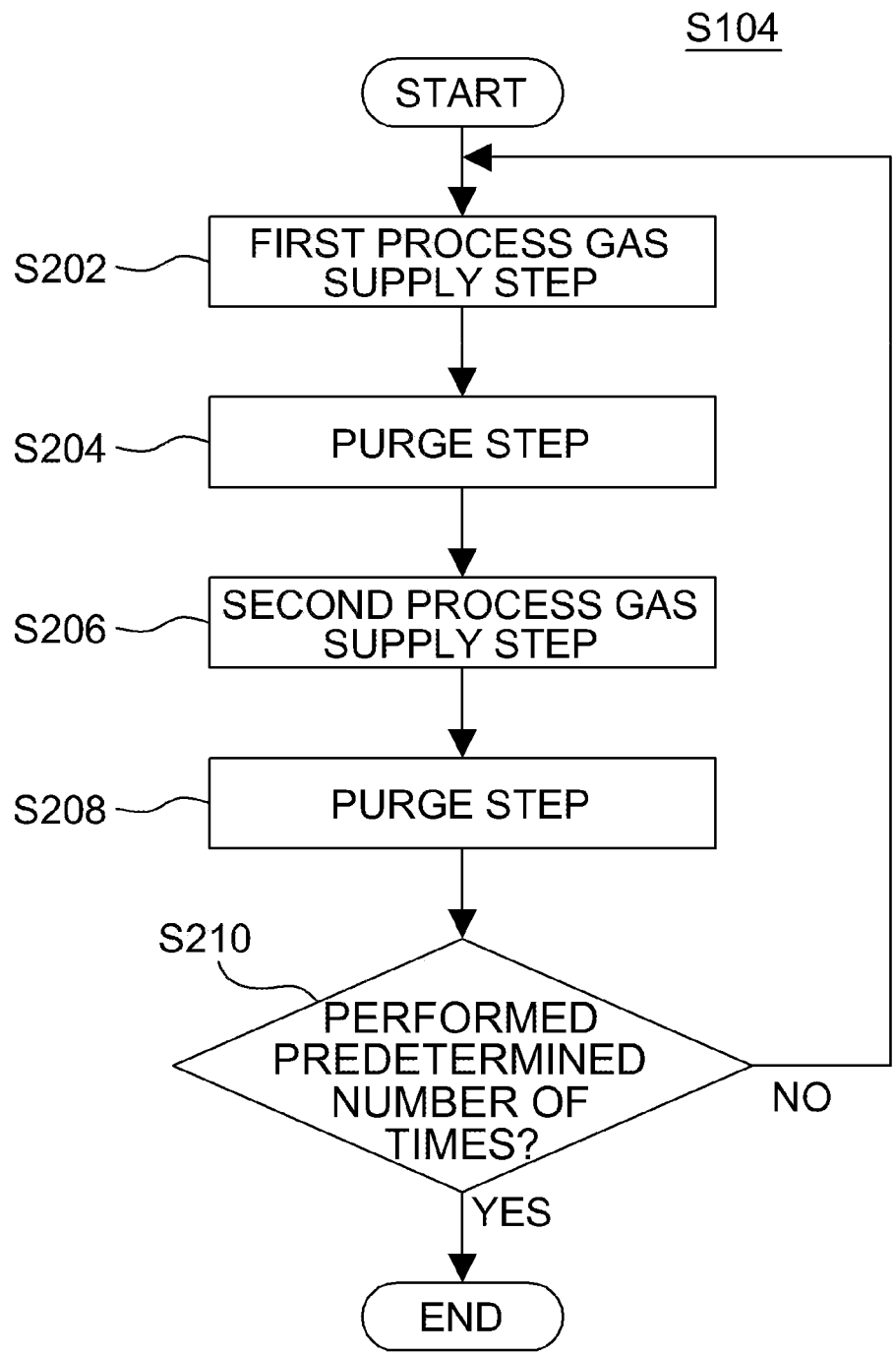
FIG. 6 is a flowchart illustrating a film forming step illustrated in FIG. 5.

FIG. 5 is a flowchart illustrating the substrate processing step according to the first embodiment. FIG. 6 is a flowchart illustrating the details of the film forming step S104.

Hereafter, an example in which a titanium nitride film is formed using $TiCl_4$ gas and $NH_3$ gas as first and second process gases, respectively, will be described.

[Substrate Loading/Placing/Heating Step S102]

In the substrate processing apparatus 100, the substrate placing table 212 is lowered to the transfer position of the wafer 200 such that the lift pins 207 pass through the through-holes 214 of the substrate placing table 212. As a result, the lift pins 207 protrude by a predetermined level from the surface of the substrate placing table 212. Then, as the gate valve 205 is opened, the transfer space 203 is in communication with a transfer chamber (not illustrated). The wafer 200 is transferred to the transfer space 203 from the transfer chamber by a wafer transfer machine (not illustrated), and placed on the lift pins 207. Thus, the wafer 200 is horizontally supported on the lift pins 207 protruding from the upper surface of the substrate placing table 212.

Then, an inert gas is supplied between the shaft 217 and the inner wall of the hole 208 through the inert gas supply pipe 221a.

When the wafer 200 is loaded into the process container 202, the wafer transfer machine (not illustrated) is retreated to the outside of the process container 202, and the gate valve 205 is closed to seal the process container 202. Then, as the substrate placing table 212 is lifted, the wafer 200 is placed on the floating pins 320 installed on the substrate placing table 212. As the substrate placing table 212 is further lifted, the wafer 200 is lifted to the process position in the process space 201 described above.

When the wafer 200 is lifted to the process position in the process space 201 after being loaded into the transfer space 203, the valves 266 and 267 are closed. The valve 266 blocks the transfer space 203 and the TMP 265 from communicating with each other, and the valve 267 blocks the TMP 265 and the exhaust pipe 264 from communicating with each other. Then, the exhaust of the transfer space 203 by the TMP 265 is ended. As the valve 275 is opened, the process space 201 and the APC 276 communicate with each other, and as the valve 288 is opened, the APC 276 and DP 278 communicate with each other. The APC 276 adjusts the conductance of the exhaust pipe 362 so as to control the exhaust flow rate of the process space 201 by the DP 278, thereby maintaining the process space 201 at a predetermined pressure (for example, a high-degree vacuum of $10^{-5}$ Pa to $10^{-1}$ Pa).

Simultaneously, an inert gas is supplied between the shaft 217 and the inner wall of the hole 208 through the inert gas supply pipe 221a. Thus, a gas staying around the lower portion of the shaft 217 is prevented from permeating into the bellows 219.

While the process container 202 is exhausted at the substrate loading/placing/heating step S102, $N_2$ gas may be supplied as an inert gas into the process container 202 through the inert gas supply system. That is, while the process container 202 is exhausted by the TMP 265 or DP 278, at least the valve 245d of the third gas supply system 245 may be opened to supply $N_2$ gas into the process container 202.

When the wafer 200 is placed on the substrate placing table 212, power is supplied to the heater 213 buried in the substrate placing table 212. Thus, the surface of the wafer 200 is controlled to a predetermined temperature. For example, the temperature of the wafer 200 ranges from room temperature to 500° C., or desirably ranges from room temperature to 400° C. At this time, the temperature of the heater 213 is adjusted by controlling the power supplied to the heater 213, based on temperature information detected by a temperature sensor (not illustrated).

[Film Forming Step S104]

Next, the film forming step S104 is performed. Hereafter, referring to FIG. 6, the film forming step S104 will be described in detail. The film forming step S104 includes an alternate supply step of alternately supplying different process gases.

[First Process Gas Supply Step S202]

When the wafer 200 is heated to reach a desired temperature, the controller 280 opens the valve 243d, and controls the MFC 243c such that a flow rate of $TiCl_4$ gas becomes a predetermined flow rate. The flow rate of supplied $TiCl_4$ gas ranges from 100 sccm to 5,000 sccm, for example. Simultaneously, as the valve 245d of the third gas supply system 245 is opened, $N_2$ gas is supplied through the third gas supply pipe 245a. $N_2$ gas may be supplied through the first inert gas supply system. Before the first process gas supply step S202, $N_2$ gas may be supplied through the third gas supply pipe 245a.

Then, an inert gas is supplied to the gap 250a from the inert gas supply pipe 221a. Simultaneously, the bellows 219 is exhausted through the bellow-side exhaust pipe 222a. The amount of supplied inert gas is larger than that in a purge step S208 described later. When the amount of supplied inert gas is larger than that in the purge step S208 described later, the first gas can be reliably prevented from permeating into the bellows 219.

$TiCl_4$ gas supplied into the process space 201 through the first dispersion mechanism 241 is supplied onto the wafer 200. As $TiCl_4$ gas comes in contact with the surface of the wafer 200, a titanium-containing layer is formed as "first element containing layer".

The titanium-containing layer has a predetermined thickness and distribution, according to parameters such as the internal pressure of the process container 202, the flow rate of $TiCl_4$ gas, the temperature of the susceptor 217, and the time during which $TiCl_4$ gas stays in the process space 201. A predetermined film may be formed on the wafer 200 in advance. A predetermined pattern may be formed on the wafer 200 or the predetermined film in advance.

When a predetermined time has elapsed after the supply of $TiCl_4$ gas was started, the valve 243d is closed to stop supplying $TiCl_4$ gas. At the step S202, the valves 275 and 288 are opened, and the internal pressure of the process space 201 is adjusted to a predetermined pressure. At the step S202, the valves of the exhaust system other than the valves 275 and 288 are all closed.

[Purge step S204]

Next, $N_2$ gas is supplied through the third gas supply pipe 245a so as to purge the shower head 230 and the process space 201. At this time, the valves 275 and 288 are opened, and the internal pressure of the process space 201 is adjusted to a predetermined pressure by the APC 276. The valves of the exhaust system other than the valves 275 and 288 are all closed. At the first process gas supply step S202, $TiCl_4$ gas which is not coupled to the wafer 200 is removed from the process space 201 through the exhaust pipe 362 by the DP 278.

Then, $N_2$ gas is supplied through the third gas supply pipe 245a so as to purge the shower head 230. The valves 275 and 288 are closed, and the valves 279 and 291 are opened. The valves of the exhaust system other than the valves 275 and 288 are all opened. That is, when the shower head 230 is purged, the process space 201 may be blocked from the APC 276, and the APC 276 may be blocked from the exhaust pipe 264. Thus, while the pressure control by the APC 276 is stopped, the buffer space 232 and the DP 278 communicate with each other. Therefore, $TiCl_4$ gas remaining in the shower head 230 [the buffer space 232] is discharged from the shower head 230 through the exhaust pipe 362 by the DP 278.

Following the first process gas supply step S202, an inert gas is supplied between the shaft 217 and the inner wall of the hole 208 through the inert gas supply pipe 221a. At this time, the amount of supplied inert gas is smaller than that in the first process gas supply step S202. As the amount of supplied inert gas is set to be smaller than that in the first process gas supply step S202, the gas can be efficiently used.

In order to remove $TiCl_4$ gas remaining in the wafer 200, the process space 201 and the buffer space 232, a large amount of purge gas is supplied to raise the exhaust efficiency at the purge step S204.

When the internal atmosphere of the shower head 230 is completely purged, the valves 288 and 275 are opened to resume pressure control through the APC 276, while the valve 279 is closed to block the shower head 230 from the exhaust pipe 264. The valves of the exhaust system other than the valves 288 and 275 are all closed. Even at this time, N₂ gas is continuously supplied through the third gas supply pipe 245a so as to purge the shower head 230 and the process space 201. At the purge step S204, the purge operation through the exhaust pipe 363 before and after the purge operation through the exhaust pipe 362 is exemplified. However, only the purge operation through the exhaust pipe 362 may be performed. Furthermore, the purge operation through the exhaust pipe 362 and the purge operation through the exhaust pipe 363 may be performed at the same time.

[Second Process Gas Supply Step S206]

Before the step S206, the valve 244d is opened to store a second process gas in the tank 244e, until the step S206 is started. At the step S206, the remote plasma unit 244g is started.

After the purge step S204 is performed, the valve 244f is opened to supply the second process gas to the remote plasma unit 244g at a time. Hereafter, an operation of supplying a gas stored in the tank at a time will be referred to as "flash flow".

At this time, the internal pressure of the remote plasma unit 244g is adjusted to a high pressure at which plasma can be generated. As described later, the pressure of the atmosphere around the wafer 200 may be set to a high pressure at which plasma can be generated.

The second process gas in a plasma state, supplied from the remote plasma unit 244g, is supplied into the process space 201 through the shower head 230. The supplied gas reacts with the film on the wafer 200, the film having an element contained in the first process gas as a main component.

The case in which the pressure of the atmosphere around the wafer 200 is set to a high pressure at which plasma can be generated will be described below. When the second process gas is supplied onto the wafer 200, a large amount of second process gas may be supplied. In this specification, "large amount" indicates that the amount of gas supplied per unit time is larger than that in the first process gas supply step S202, for example. The large mount of second process gas may be supplied to raise the pressure of the atmosphere around the wafer 200.

The reason why the pressure of the atmosphere around the wafer 200 is set to a high pressure is as follows. While the first process gas mainly serves to form a film on the wafer 200, the second process gas mainly serves to react with the film which is already formed on the wafer 200, the film having an element contained in the first process gas as a main component. Thus, when the second process gas reacts with the film, higher energy is required than when the first process gas simply forms the film. Therefore, the second process gas may be supplied at high pressure.

As the pressure of the atmosphere around the wafer 200 is set to a high pressure, the film having an element contained in the first process gas as a main component may be reacted with the second process gas within a short time. At a high pressure, the second process gas can react with the film within a short time, which makes it possible to accomplish high throughput which is recently required.

At the step S206, the valve 245d of the third gas supply system is opened to supply N₂ gas through the third gas supply pipe 245a. As N₂ gas is supplied through the third gas supply pipe 245a, the second process gas is prevented from permeating into the third gas supply system.

The ammonia gas in a plasma state, supplied into the process container 202 through the first dispersion mechanism 241, is supplied onto the wafer 200. The titanium-containing layer formed on the wafer 200 is modified by the ammonia gas in a plasma state, and a modified layer containing titanium and nitrogen elements is formed on the wafer 200.

The modified layer has a predetermined thickness, a predetermined distribution, and a penetration depth of nitrogen element with respect to the titanium-containing layer, according to parameters such as the internal pressure of the process container 202, the flow rate of nitrogen-containing gas, the temperature of the substrate placing table 212, and the state of power supplied to the remote plasma unit 244g.

After a predetermined time has elapsed, the valve 244d is closed to stop supplying the nitrogen-containing gas.

At the step S206, the valves 275 and 288 are opened, and the internal pressure of the process space 201 is adjusted to a predetermined pressure by the APC 276, as in the step S202 described above. The valves of the exhaust system other than the valves 275 and 288 are all closed.

Following the purge step S204, an inert gas is supplied between the shaft 217 and the inner wall of the hole 208 through the inert gas supply pipe 221a. The amount of supplied inert gas is larger than that in the purge step S204. As the amount of supplied inert gas is larger than that in the purge step S204, the permeation of the second gas can be reliably prevented.

[Purge Step S208]

Next, the same purge step as the step S204 is performed. Since the components constituting the substrate processing apparatus 100 are operated in the same manner as the step S204, the detailed descriptions thereof are omitted herein.

[Determination Step S210]

The controller 280 determines whether a cycle including the steps S202, S204, S206 and S208 was performed a predetermined number of times (n cycles).

When the cycle was not performed the predetermined number of times [No at the step S210], the cycle including the first process gas supply step S202, the purge step S204, the second process gas supply step S206 and the purge step S208 is repeated. When the cycle was performed the predetermined number of times [Yes at the step S210], the process illustrated in FIG. 6 is ended.

At the first process gas supply step S202, the first process gas may leak through the gap between the substrate placing table 212 and the partition plate 204, permeate into the transfer space 203, and reach the substrate loading/unloading port 206. Similarly, at the second process gas supply step, the second process gas may leak through the gap between the substrate placing table 212 and the partition plate 204, permeate into the transfer space 203, and reach the substrate loading/unloading port 206. Since the process space 201 and the transfer space 203 are partitioned by the substrate placing table 212 and the partition plate 204, it is difficult to exhaust the transfer space 203 through the purge steps S204 and S206. Thus, as gases around the substrate loading/unloading port 206 react with each other, a film may be formed on the inner surface of the substrate loading/unloading port 206, a surface of the valve body 205a, facing the transfer space 203, or the component falling prevention unit 250. The formed film may become particles at the substrate loading/placing/heating step S102. Thus, it is necessary to periodically perform maintenance on the component falling prevention unit 250.

[Determination Step S106]

Referring back to FIG. 5, a determination step S106 is performed. At the determination step S106, the controller 280 determines whether the film forming step S104 was performed a predetermined number of times. The predetermined number of times corresponds to criteria for determining whether to perform maintenance. When it is determined at the determination step S106 that the film forming step S104 was not performed the predetermined number of times, the procedure proceeds to the substrate loading/unloading step S108 because no maintenance is needed. When the film forming step S104 was performed the number of times, the controller 280 determines that maintenance is needed, and proceeds to the substrate unloading step S110.

[Substrate Unloading/Loading Step S108]

When it is determined at the determination step S106 that the film forming step S104 was not performed the predetermined number of times, the processed wafer 200 is unloaded in the opposite sequence of the substrate loading/placing/heating step S102. Next, an unprocessed wafer 200 is loaded in the same sequence as the substrate loading/placing/heating step S102. Then, the film forming step S104 is performed on the loaded wafer 200.

[Substrate Unloading Step S110]

At a substrate unloading step S110, the substrate placing table 212 is lowered, and the wafer 200 is supported on the lift pins 207 protruding from the upper surface of the substrate placing table 212. Thus, the wafer 200 is moved from the process position to the transfer position. Then, the gate valve 205 is opened, and the wafer 200 is transferred out of the process container 202 by the wafer transfer machine. As this time, the valve 245d is closed to stop supplying an inert gas into the process container 202 through the third gas supply system.

Then, when the wafer 200 is moved to the transfer position, the valves 275 and 288 are closed to block the transfer space 203 and the exhaust pipe 264 from communicating with each other. As the valves 266 and 267 are opened to exhaust the transfer space 203 through the TMP 265 [and the DP 278], the process container 202 is maintained in a high-degree vacuum (ultra high-degree vacuum) state (for example, $10^{-5}$ Pa or less). Thus, a pressure difference between the process container 202 and the transfer chamber (not illustrated) is reduced, the transfer chamber being maintained in a high-degree vacuum (ultra high-degree vacuum) state (for example, $10^{-6}$ Pa or less). Meanwhile, an inert gas is supplied between the shaft 217 and the inner wall of the hole 208 through the inert gas supply pipe 221a, such that particles penetrate the inner space of the bellows 219. In this state, the gate valve 205 is opened, and the wafer 200 is unloaded from the process container 202 into the transfer chamber (not illustrated).

[Maintenance Step S112]

After the substrate unloading step S110, a maintenance step S112 is performed. In order to describe the film forming step S104 of the first embodiment, the flash flow and the alternate supply of the first and second process gases have been taken as an example. In these methods, a film adheres to the wall constituting the transfer space 203 as well as the wall constituting the process space 201 or the buffer space 232. Depending on a condition such as a pressure variation, the screws and the like may be loosened. Thus, the following maintenance is performed.

First, maintenance for the shower head 230 will be described. For example, when the second process gas supply step S206 is performed, the first and second process gases remaining in the shower head 230 or the through-holes 234a react with each other, such that a film adheres to the wall of the shower head 230 or the through-holes 234a. The film adhering to the wall of the shower head 230 or the through-holes 234a has a different characteristic from the film formed on the wafer 200. The film adhering to the wall of the shower head 230 or the through-holes 234a is formed in a state where the film forming condition is not controlled. Thus, the film adhering to the wall of the shower head 230 or the through-holes 234a is sparser than the film formed on the wafer 200. The sparse film is easily peeled off because the stress thereof is not uniform.

Since the peeled film has an adverse effect on the wafer, the maintenance step S112 is periodically performed. At the maintenance step, the film adhering to the through-holes 234a or the wall surface constituting the buffer space 232, such as the gas guide 235, is cleaned. At this time, the screws 301 and 302 fixing the dispersion plate 234 are detached, and the dispersion plate 234 is detached. The dispersion plate 234 is subjected to a separate cleaning process. Similarly, the screw 303 is detached, and the gas guide 235 is then detached. The gas guide 235 is subjected to a separate cleaning process.

Next, maintenance for the shaft 217 or the substrate placing table 210 (hereafter, referred to as "substrate placing table or the like") will be described. As described above, a pressure variation frequently occurs at the film forming step S104. Thus, the wafer 200 may be moved on the substrate placing surface 211. In this case, while the rear surface of the wafer 200 grazes the substrate placing surface 211 or the front ends of the floating pins 320, a scratch may be formed on the substrate placing surface 211. The scratch may form a scratch on a newly placed wafer 200, thereby forming new particles. Thus, the substrate placing table 212 needs to be periodically replaced. The substrate placing table 212 and the shaft 217 are fixed and integrated by welding. Thus, when the substrate placing table 212 is replaced, the shower head 230 is first opened, and the substrate placing table 212 and the shaft 217 are lifted from the top of the process container 202 and detached from the process container 202. Since the substrate placing table or the like is expensive, the maintenance frequency of the substrate placing table or the like is lower than the maintenance frequency of the other components.

When the floating pins 320 are loosened by frequent pressure variations, a difference may occur between the heights of the floating pins 320 on the substrate placing surface 211. Then, since the distance between the wafer 200 and the heater 213 is changed, the temperature on the surface of the wafer 200 becomes uneven. Thus, when the floating pins 320 are loosened, the floating pins 320 are detached and then fixed again.

Next, maintenance for the component falling prevention unit 250 will be described. In order to shorten the processing time, substrate processing is performed in a high-pressure state. When substrate processing is performed in a high-pressure state, a large amount of process gas is moved from the process space 201 to the transfer space 203. The moved gas adheres to the surface of the component falling prevention unit 250. The film adhering to the component falling prevention unit 250 is an undesired film, and easily peeled off. Thus, when an operation of opening the gate valve 205, lifting/lowering the shaft 217, or supplying an inert gas through the inert gas supply pipe 221a is performed, the film adhering to the component falling prevention unit 250 is peeled off and diffused into the transfer space 203. The film diffused into the transfer space 203 has an adverse effect on the wafer 200. Thus, the film adhering to the component falling prevention unit 250 is periodically removed. When the adhering film is removed, the component falling prevention unit 250 is disassembled into the first and second structures 251 and 252, and detached from the bottom portion 202c. The detached component falling prevention unit 250 is exchanged with a new component falling prevention unit 250. Since the first or second structure 251 or 252 has a lower price than the substrate placing table or the like, the maintenance frequency of the first or second structure 251 or 252 may be higher than the maintenance frequency of the substrate placing table or the like.

At the maintenance step, the maintenance frequencies may be set in consideration of adverse effects on the film formation or component prices. In the first embodiment, the maintenance frequencies are set in their order of probability that the components have an adverse effect on the film formed on the wafer 200. For example, the maintenance frequency of the shower head or the floating pins installed at a position close to the wafer 200 may be set to the highest frequency, and the maintenance frequency of the component falling prevention unit 250 is set to the second highest frequency. When the maintenance frequency is low, it may indicate that the maintenance is performed on the component having the highest maintenance cost, for example, the substrate placing table or the like.

Since the component falling prevention unit 250 is frequently detached in a state where the shaft 217 is inserted into the hole 208 and the bellows 219, the component falling prevention unit 250 may be constituted by parts which can be disassembled, in order to facilitate the detachment.

Second Embodiment

Next, referring to FIGS. 8A and 8B and 9A and 9B, a second embodiment will be described. FIG. 8A is a plan view of a component falling prevention unit 260, and FIG. 8B is a cross-sectional view taken along the line γ-γ' of FIG. 8A. FIG. 9A is a bottom view of the component falling prevention unit 260, and FIG. 9B is a side view of the component falling prevention unit 260 seen from a direction a. The component falling prevention unit 260 according to the second embodiment is a modification of the component falling prevention unit 250 according to the first embodiment. Thus, the following descriptions will be focused on the component falling prevention unit 260. Since the other components of the substrate processing apparatus 100 are the same as those of the first embodiment, the detailed descriptions thereof are omitted herein.

The component falling prevention unit 260 is placed on the upper surface of the bottom portion 202c, and placed at the outer circumference of the shaft 217 with a gap 260a interposed therebetween. The component falling prevention unit 260 includes a first structure 261 and a second structure 262. When the first and second structures 261 and 262 are combined, the resultant structure has a ring shape. The gap 260a is disposed between the shaft 217 and the inner circumferences of the first and second structures 261 and 262. The gap 260a is sufficiently wide such that an expansion of the shaft 217 by heat can be absorbed when the substrate 200 is processed.

The first structure 261 includes a lower portion 261a inserted into the hole 208 and a lower member 261b supported by the bottom portion 202c. The first structure 261 includes an inert gas flow path 261c and a lid 261d. The inert gas flow path 261c is formed at a lateral region of the first structure 261 [component falling prevention unit 260] throughout the lower member 261b from the lower portion 261a, in order to discharge an inert gas, and the lid 261d serves as a part of the inert gas flow path 261c.

The lower portion 261a includes a convex structure protruding downward, and is inserted into the hole 208. The lower portion 261a runs along the shape of the hole 208. The component falling prevention unit 260 is fixed to the edge of the hole 208 by the lower portion 261a. Thus, the component falling prevention unit 260 is prevented from deviating in a horizontal direction. A space is formed at the inner circumference side (shaft side) of the lower portion 261a, and is a part of the inert gas flow path 261c.

The lower member 261b is placed on the bottom portion 202c. The lower member 261b is in contact with the lid 261d. The space under the lid 261d serves as a part of the inert gas flow path 261c. The lower member 261b has an exhaust hole 261e formed on the outer circumferential surface thereof, the exhaust hole 261e corresponding to a part of the inert gas flow path 261c. The exhaust hole 261e is configured to radially discharge an inert gas. A plurality of exhaust holes 261e may be installed on the outer circumferential surface of the lower member 261b, and have a slit shape.

The inert gas flow path 261c has an L-shaped cross-sectional surface constituted by the lower portion 261a, the lid 261d and the lower member 261b. As denoted by an arrow in FIG. 8B, an inert gas supplied through the inert gas supply pipe 221a passes through the lower portion 261a, and a part of the inert gas collides with the lower surface of the lid 261d and is then discharged toward a lateral region 263 of the lower member 261b through the exhaust hole 261e. The other inert gas which does not collide with the lower surface of the lid 261d is discharged through the gap 260a.

The inert gas is continuously supplied while at least the film forming step S104 is performed. As the inert gas is continuously supplied while at least the film forming step S104 is performed, the process gas is prevented from being congested in the lateral region 263 as described later.

Next, the reason that the component falling prevention unit 260 is configured as described above will be described in comparison to a comparative example. Unlike the second embodiment, the comparative example includes the first and second structures 261 and 262 without the flow path 261c and the exhaust hole 261e. In the comparative example, an inert gas is not discharged to the lateral region 263.

As described above, the process gas permeates into the transfer space 203 while the film forming step S104 is performed. Thus, an undesired film may be formed around the component falling prevention unit 260.

The comparative example has the following problems. The lateral region 263 of the component falling prevention unit 260 includes an angled portion constituted by a side surface of the lower member 261b and the upper surface of the bottom portion 202c. A gas more easily stays on the angled portion than on the upper surface of the bottom portion 202c or the upper surface of the lid 261d. That is, an undesired film may be more rapidly formed on the angled portion than on the surface of the bottom portion 202c or the lid 261d. Furthermore, since the inert gas supplied from below collides with the lower surface of the lid 261d, the first and second structures 261 and 262 may float. When the first structure 261 floats, the gas may permeate between the lower member 261b and the bottom portion 202c. Thus, an undesired film is likely to be formed between the lower member 261b and the bottom portion 202c. Thus, in the comparative example, maintenance needs to be frequently performed, depending on the state of the film formed on the angled portion or the film formed between the bottom portion 202c and the lower member 261b.

In the second embodiment, however, when the exhaust holes 261e are installed to discharge the inert gas to the lateral region 263 through the exhaust holes 261e, it is possible to prevent the gas from being congested in the lateral region 263. Since the inert gas colliding with the lower surface of the lid 261d is discharged to the lateral region 263, the first and second structures 261 and 262 do not float. Thus, in the second embodiment, frequent maintenances caused by the lateral region 263 in the comparative example do not need to be performed, which makes it possible to increase the operation efficiency of the apparatus.

Since the second structure 272 has the same structure as the first structure, the detailed descriptions thereof are omitted herein.

Third Embodiment

Figure 10A:
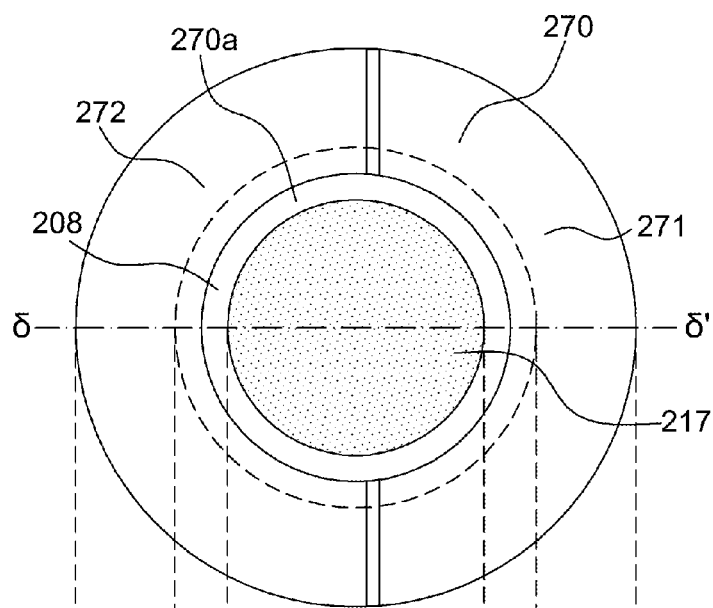
FIGS. 10A and 10B are diagrams illustrating a component falling prevention unit according to a third embodiment described herein.
Figure 10B:
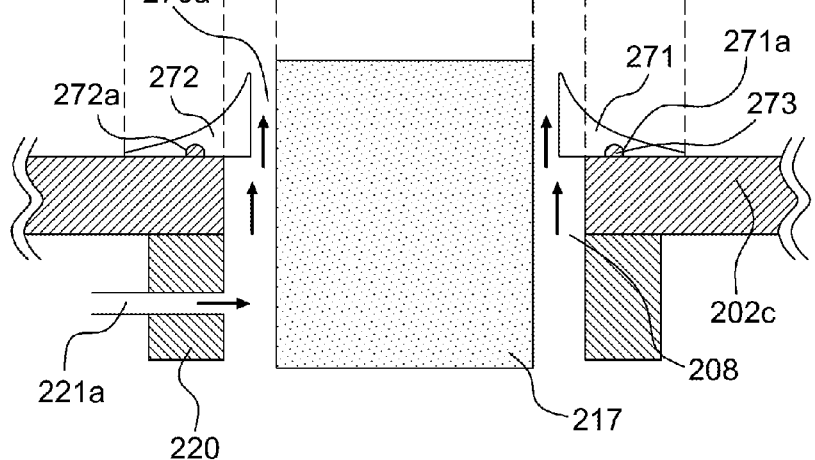

Next, referring to FIGS. 10A and 10B, a third embodiment will be described. FIG. 10A is a plan view of a component falling prevention unit 270, and FIG. 10B is a cross-sectional view taken along the line δ-δ' of FIG. 10A. The component falling prevention unit 270 according to the third embodiment is a modification of the component falling prevention unit 250 according to the first embodiment. Thus, the following descriptions will be focused on the component falling prevention unit 270. Since the other components of the substrate processing apparatus 100 are the same as those of the first embodiment, the detailed descriptions thereof are omitted herein.

The component falling prevention unit 270 is placed on the upper surface of the bottom portion 202c, and placed at the outer circumference of the shaft 217 with a gap 270a interposed therebetween. The component falling prevention unit 270 includes a first structure 271 and a second structure 272. When the first and second structures 261 and 262 are combined, the resultant structure has a ring shape.

The height of the first structure 271 with respect to the upper surface of the bottom portion 202c increases toward the shaft 217. As illustrated in FIGS. 10A and 10B, the first structure 271 is an arched structure. As the height of the first structure 271 is gradually increased, a falling screw can be prevented from falling into the bellows 219 even though the screw approaches the shaft 217, and collected at the outer circumference of the component falling prevention unit 270. Thus, when a plurality of screws falls during maintenance, the falling screws can be easily found.

As the outer circumference of the first structure 271 is connected from the bottom portion 220c (arched structure), a gas can be prevented from being congested as in the comparative example described in the second embodiment.

Since the second structure 272 has the same structure as the first structure, the detailed descriptions thereof are omitted herein.

In the third embodiment, as the gap 270a is reduced while adjusting the amount of gas supplied through the inert gas supply pipe 221a, the pressure of the gap 270a may be set to such an extent that the process gas does not permeate into the gap 270a. Thus, a film is prevented from adhering to the bellows 219.

In the embodiments described above, various configurations of the component falling prevention unit have been described. In the embodiments described above, the component falling prevention unit is constituted by a combination of two structures. However, the component falling prevention unit may include any structures as long as they can be radially disassembled while being placed around the shaft 217. For example, the component falling prevention unit may include a combination of three or more structures.

In the embodiments described above, the plurality of structures are combined to constitute a circular component falling prevention unit. However, the component falling prevention unit is not limited to a perfect circle, but only a part of the plurality of structures of the component falling prevention unit may have a circular shape.

In this specification, the technique for forming a film has been described as typical embodiments. However, the techniques described herein are not limited to the technique for forming a film. The techniques described herein may be applied to cases in which other substrate processing processes are performed, the other substrate processing processes including a process of forming another film in place of the thin film exemplified in the embodiment described above, a diffusion process, an oxidation process, a nitridation process, and a lithography process. The techniques described herein may be applied to other substrate processing apparatus such as a thin film forming apparatus, an etching apparatus, an oxidation apparatus, a nitridation apparatus, a coating apparatus and a heating apparatus as well as an annealing apparatus. A part of the components of any one embodiment among the embodiments described above can be replaced with components of another embodiment, and the components of any one embodiment can be added to the components of another embodiment. A part of the components of each embodiment can be added, removed or replaced as other components.

In the embodiments described above, $TiCl_4$ gas is set to the first element containing gas, and Ti is set to the first element. However, the techniques disclosed in this specification are not limited thereto. For example, another element such as Si, Zr and Hf may be used as the first element. Furthermore, $NH_3$ is set to the second element containing gas, and N is set to the second element. However, the techniques disclosed in this specification are not limited thereto. For example, an element such as O may be used as the second element.

The substrate processing apparatus can suppress the formation of particles.

What is claimed is:
1. A substrate processing apparatus comprising:
a process container where a substrate is processed;
a process gas supply unit configured to supply a process gas into the process container;
a shaft penetrating a hole at a bottom portion of the process container;
a substrate support installed in the process container and coupled to an upper end of the shaft;
a bellows surrounding the shaft and disposed outside of the process container wherein an inner space thereof is in communication with a space of the process container;
an inert gas supply system configured to supply an inert gas into the inner space of the bellows disposed outside of the process container; and
a component falling prevention unit comprising a first structure disposed along a first portion of the hole at the bottom of the process container and a second structure disposed along a second portion of the hole adjacent to the first structure, wherein each of the first structure and the second structure comprises: a lower member supported by the bottom portion; a cover covering the lower member to define an inert gas channel between the a lower member and the cover; and an exhaust hole disposed at an end of the inert gas channel along an entire outer circumference of each of the first structure and the second structure to exhaust the inert gas supplied into the inner space in a radial direction.

2. The substrate processing apparatus of claim 1, wherein each of the first structure and the second structure is L-shaped to define the inert gas channel having a L-shape, and a vertical portion of each of the first structure and the second structure extends downward into the hole along a circumference of the hole.

3. The substrate processing apparatus of claim 2, wherein the first structure is adjacent to the shaft with a gap there between.

4. The substrate processing apparatus of claim 2, wherein an inner circumference of the first structure runs along a circumference of the shaft.

5. The substrate processing apparatus of claim 2, wherein the inert gas supply unit is further configured to supply the inert gas into the inner space of the bellows while the process gas supply unit supplies the process gas.

6. The substrate processing apparatus of claim 2, wherein a height of the component falling prevention unit increases toward the shaft.

7. The substrate processing apparatus of claim 2, further comprising a shower head disposed over the substrate placing table, wherein the shower head comprises a detachable dispersion plate.

8. The substrate processing apparatus of claim 2, further comprising a detachable floating pin disposed at the substrate placing table.

9. The substrate processing apparatus of claim 1, wherein the first structure is adjacent to the shaft with a gap therebetween.

10. The substrate processing apparatus of claim 9, wherein an inner circumference of the first structure runs along a circumference of the shaft.

11. The substrate processing apparatus of claim 9, wherein the inert gas supply unit is further configured to supply the inert gas into the inner space of the bellows while the process gas supply unit supplies the process gas.

12. The substrate processing apparatus of claim 9, wherein a height of the component falling prevention unit increases toward the shaft.

13. The substrate processing apparatus of claim 9, further comprising a shower head disposed over the substrate placing table, wherein the shower head comprises a detachable dispersion plate.

14. The substrate processing apparatus of claim 9, further comprising a detachable floating pin disposed at the substrate placing table.

15. The substrate processing apparatus of claim 1, wherein the inert gas supply unit is further configured to supply the inert gas into the inner space of the bellows while the process gas supply unit supplies the process gas.

16. The substrate processing apparatus of claim 15, wherein a height of the component falling prevention unit increases toward the shaft.

17. The substrate processing apparatus of claim 15, further comprising a shower head disposed over the substrate placing table, wherein the shower head comprises a detachable dispersion plate.

18. The substrate processing apparatus of claim 15, further comprising a detachable floating pin disposed at the substrate placing table.

* * * * *